(12) United States Patent
Chui et al.

(10) Patent No.: US 7,982,700 B2
(45) Date of Patent: *Jul. 19, 2011

(54) CONDUCTIVE BUS STRUCTURE FOR INTERFEROMETRIC MODULATOR ARRAY

(75) Inventors: Clarence Chui, San Jose, CA (US); Jeffrey B. Sampsell, Pueblo West, CO (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 800 days.

This patent is subject to a terminal disclaimer.

(21) Appl. No.: 11/875,613

(22) Filed: Oct. 19, 2007

(65) Prior Publication Data

US 2008/0080043 A1    Apr. 3, 2008

Related U.S. Application Data

(63) Continuation of application No. 11/057,045, filed on Feb. 11, 2005, now Pat. No. 7,289,259.

(60) Provisional application No. 60/613,372, filed on Sep. 27, 2004.

(51) Int. Cl.
    *G09G 3/34*    (2006.01)
(52) U.S. Cl. .......................................... 345/85; 345/108
(58) Field of Classification Search ................. 345/85, 345/108
    See application file for complete search history.

(56) References Cited

U.S. PATENT DOCUMENTS

| 2,590,906 | A | 4/1952 | Tripp |
|---|---|---|---|
| 2,677,714 | A | 5/1954 | Auwarter |
| 3,247,392 | A | 4/1966 | Thelen |
| 3,679,313 | A | 7/1972 | Rosenberg |
| 3,728,030 | A | 4/1973 | Hawes |
| 3,886,310 | A | 5/1975 | Guldberg |
| 3,955,190 | A | 5/1976 | Teraishi |
| 4,403,248 | A | 9/1983 | te Velde |
| 4,421,381 | A | 12/1983 | Ueda et al. |
| 4,441,789 | A | 4/1984 | Pohlack |
| 4,441,791 | A | 4/1984 | Hornbeck |
| 4,497,974 | A | 2/1985 | Deckman et al. |
| 4,498,953 | A | 2/1985 | Cook et al. |
| 4,560,435 | A | 12/1985 | Brown et al. |
| 4,655,554 | A | 4/1987 | Armitage |
| 4,779,959 | A | 10/1988 | Saunders |
| 4,786,128 | A | 11/1988 | Birnbach |

(Continued)

FOREIGN PATENT DOCUMENTS

EP    0 668 490    8/1995

(Continued)

OTHER PUBLICATIONS

Longhurst, 1963, Chapter IX: Multiple Beam Interferometry, in Geometrical and Physical Optics, pp. 153-157.

(Continued)

*Primary Examiner* — Kevin M Nguyen
(74) *Attorney, Agent, or Firm* — Knobbe Martens Olson & Bear LLP

(57) ABSTRACT

Embodiments of an interferometric modulator are disclosed having various enhancements and features including a conductive bus. In certain embodiments, the interferometric modulator has a first conductive layer suspended over a second electrode layer. In certain embodiments, a second conductive layer is provided over the first conductive layer. One of the first and/or second conductive buses may further connect to the first electrode layer and/or the second electrode layer. Other disclosed features can be incorporated into embodiments of the interferometric modulator to improve response time, power consumption, and image resolution.

22 Claims, 25 Drawing Sheets

U.S. PATENT DOCUMENTS

| | | |
|---|---|---|
| 4,859,060 A | 8/1989 | Katagiri et al. |
| 4,925,259 A | 5/1990 | Emmett |
| 4,954,789 A | 9/1990 | Sampsell |
| 4,956,619 A | 9/1990 | Hornbeck |
| 4,973,131 A | 11/1990 | Carnes |
| 4,982,184 A | 1/1991 | Kirkwood |
| 5,022,745 A | 6/1991 | Zayhowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,170,283 A | 12/1992 | O'Brien et al. |
| 5,315,370 A | 5/1994 | Bulow |
| 5,381,232 A | 1/1995 | Van Wijk |
| 5,452,138 A | 9/1995 | Mignardi et al. |
| 5,471,341 A | 11/1995 | Warde et al. |
| 5,526,172 A | 6/1996 | Kanack |
| 5,550,373 A | 8/1996 | Cole et al. |
| 5,559,358 A | 9/1996 | Burns et al. |
| 5,561,523 A | 10/1996 | Blomberg et al. |
| 5,597,736 A | 1/1997 | Sampsell |
| 5,600,383 A | 2/1997 | Hornbeck |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goosen |
| 5,719,068 A | 2/1998 | Suzawa et al. |
| 5,734,177 A | 3/1998 | Sakamoto |
| 5,771,116 A | 6/1998 | Miller et al. |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,870,221 A | 2/1999 | Goossen |
| 5,914,804 A | 6/1999 | Goossen |
| 5,920,418 A | 7/1999 | Shiono et al. |
| 5,961,848 A | 10/1999 | Jacquet et al. |
| 5,986,796 A | 11/1999 | Miles |
| 6,028,689 A | 2/2000 | Michalicek et al. |
| 6,031,653 A | 2/2000 | Wang |
| 6,040,937 A | 3/2000 | Miles |
| 6,046,659 A | 4/2000 | Loo et al. |
| 6,055,090 A | 4/2000 | Miles |
| 6,100,861 A | 8/2000 | Cohen et al. |
| 6,242,932 B1 | 6/2001 | Hembree |
| 6,262,697 B1 | 7/2001 | Stephenson |
| 6,301,000 B1 | 10/2001 | Johnson |
| 6,327,071 B1 | 12/2001 | Kimura |
| 6,335,235 B1 | 1/2002 | Bhekta et al. |
| 6,351,329 B1 | 2/2002 | Greywall |
| 6,356,378 B1 | 3/2002 | Huibers |
| 6,377,233 B2 | 4/2002 | Colgan et al. |
| 6,381,022 B1 | 4/2002 | Zavracky |
| 6,384,952 B1 | 5/2002 | Clark et al. |
| 6,392,618 B1 | 5/2002 | Kimura et al. |
| 6,400,738 B1 | 6/2002 | Tucker et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,519,073 B1 | 2/2003 | Goossen |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,768,555 B2 | 7/2004 | Lin et al. |
| 6,791,735 B2 | 9/2004 | Stappaerts |
| 6,794,119 B2 | 9/2004 | Miles |
| 6,813,059 B2 | 11/2004 | Hunter et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,960,305 B2 | 11/2005 | Doan et al. |
| 6,980,350 B2 | 12/2005 | Hung et al. |
| 6,982,820 B2 | 1/2006 | Tsai |
| 7,002,726 B2 | 2/2006 | Patel et al. |
| 7,006,272 B2 | 2/2006 | Tsai |
| 7,008,812 B1 | 3/2006 | Carley |
| 7,009,754 B2 | 3/2006 | Huibers |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,053,737 B2 | 5/2006 | Schwartz et al. |
| 7,072,093 B2 | 7/2006 | Piehl et al. |
| 7,075,700 B2 | 7/2006 | Muenter |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,126,741 B2 | 10/2006 | Wagner et al. |
| 7,198,973 B2 | 4/2007 | Lin et al. |
| 7,221,495 B2 | 5/2007 | Miles et al. |
| 7,236,284 B2 | 6/2007 | Miles |
| 7,245,285 B2 | 7/2007 | Yeh et al. |
| 7,372,619 B2 | 5/2008 | Miles |
| 7,459,402 B2 | 12/2008 | Doan et al. |
| 7,508,566 B2 | 3/2009 | Feenstra et al. |
| 7,554,711 B2 | 6/2009 | Miles |
| 7,852,544 B2 | 12/2010 | Sampsell |
| 7,898,722 B2 | 3/2011 | Miles |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0024711 A1 | 2/2002 | Miles |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2002/0149834 A1 | 10/2002 | Mei et al. |
| 2002/0154422 A1 | 10/2002 | Sniegowski et al. |
| 2002/0197761 A1 | 12/2002 | Patel et al. |
| 2003/0011864 A1 | 1/2003 | Flanders |
| 2003/0016428 A1 | 1/2003 | Kato et al. |
| 2003/0035196 A1 | 2/2003 | Walker |
| 2003/0043157 A1 | 3/2003 | Miles |
| 2003/0053078 A1 | 3/2003 | Missey et al. |
| 2003/0072070 A1 | 4/2003 | Miles |
| 2003/0119221 A1 | 6/2003 | Cunningham et al. |
| 2003/0123125 A1 | 7/2003 | Little |
| 2003/0138669 A1 | 7/2003 | Kojima et al. |
| 2003/0173504 A1 | 9/2003 | Cole et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1 | 3/2004 | Sampsell et al. |

| | | | | | |
|---|---|---|---|---|---|
| 2004/0058532 A1 | 3/2004 | Miles et al. | EP | 1 473 581 | 11/2004 |
| 2004/0066477 A1 | 4/2004 | Morimoto et al. | EP | 1 640 763 | 3/2006 |
| 2004/0075967 A1 | 4/2004 | Lynch et al. | JP | 56-088111 | 7/1981 |
| 2004/0076802 A1 | 4/2004 | Tompkin et al. | JP | 5-49238 | 2/1993 |
| 2004/0080035 A1 | 4/2004 | Delapierre | JP | 5-281479 | 10/1993 |
| 2004/0100594 A1 | 5/2004 | Huibers et al. | JP | 08-051230 | 2/1996 |
| 2004/0100677 A1 | 5/2004 | Huibers et al. | JP | 11211999 | 8/1999 |
| 2004/0125281 A1 | 7/2004 | Lin et al. | JP | 2002-062490 | 2/2000 |
| 2004/0125282 A1 | 7/2004 | Lin et al. | JP | 2000 147262 | 5/2000 |
| 2004/0145811 A1 | 7/2004 | Lin et al. | JP | 2001-221913 | 8/2001 |
| 2004/0147198 A1 | 7/2004 | Lin et al. | JP | 2001 249283 | 9/2001 |
| 2004/0175577 A1 | 9/2004 | Lin et al. | JP | 2002-221678 | 8/2002 |
| 2004/0184134 A1 | 9/2004 | Makigaki | JP | 2003-340795 | 2/2003 |
| 2004/0188599 A1 | 9/2004 | Viktorovitch et al. | JP | 2003 177336 | 6/2003 |
| 2004/0207897 A1 | 10/2004 | Lin | JP | 2004-012642 | 1/2004 |
| 2004/0209195 A1 | 10/2004 | Lin | JP | 2004-212638 | 7/2004 |
| 2004/0217919 A1 | 11/2004 | Pichi et al. | JP | 2004-212680 | 7/2004 |
| 2004/0218251 A1 | 11/2004 | Piehl et al. | JP | 2005 279831 | 10/2005 |
| 2004/0240032 A1 | 12/2004 | Miles | JP | 2005-308871 | 11/2005 |
| 2004/0259010 A1 | 12/2004 | Kanbe | JP | 2007 027150 | 2/2007 |
| 2005/0002082 A1 | 1/2005 | Miles | WO | WO 98/14804 | 4/1998 |
| 2005/0003667 A1 | 1/2005 | Lin et al. | WO | WO 02/024570 | 3/2002 |
| 2005/0024557 A1 | 2/2005 | Lin | WO | WO 02/086582 | 10/2002 |
| 2005/0035699 A1 | 2/2005 | Tsai | WO | WO 03/105198 | 12/2003 |
| 2005/0036095 A1 | 2/2005 | Yeh et al. | WO | WO 2006/036386 | 4/2006 |
| 2005/0046919 A1 | 3/2005 | Taguchi et al. | | | |
| 2005/0046922 A1 | 3/2005 | Lin et al. | | | |
| 2005/0046948 A1 | 3/2005 | Lin | | | |
| 2005/0068627 A1 | 3/2005 | Nakamura et al. | | | |
| 2005/0078348 A1 | 4/2005 | Lin | | | |
| 2005/0117190 A1 | 6/2005 | Iwauchi et al. | | | |
| 2005/0117623 A1 | 6/2005 | Shchukin et al. | | | |
| 2005/0128543 A1 | 6/2005 | Phillips et al. | | | |
| 2005/0133761 A1 | 6/2005 | Thielemans | | | |
| 2005/0168849 A1 | 8/2005 | Lin | | | |
| 2005/0179378 A1 | 8/2005 | Oooka et al. | | | |
| 2005/0195462 A1 | 9/2005 | Lin | | | |
| 2005/0249966 A1 | 11/2005 | Tung et al. | | | |
| 2005/0275930 A1 | 12/2005 | Patel et al. | | | |
| 2006/0007517 A1 | 1/2006 | Tsai | | | |
| 2006/0017379 A1 | 1/2006 | Su et al. | | | |
| 2006/0017689 A1 | 1/2006 | Faase et al. | | | |
| 2006/0038643 A1 | 2/2006 | Xu et al. | | | |
| 2006/0065940 A1 | 3/2006 | Kothari | | | |
| 2006/0066926 A1 | 3/2006 | Chui et al. | | | |
| 2006/0076311 A1 | 4/2006 | Tung et al. | | | |
| 2006/0082863 A1 | 4/2006 | Piehl et al. | | | |
| 2006/0220160 A1 | 10/2006 | Miles | | | |
| 2006/0262126 A1 | 11/2006 | Miles | | | |
| 2006/0262380 A1 | 11/2006 | Miles | | | |
| 2006/0268388 A1 | 11/2006 | Miles | | | |
| 2007/0020948 A1 | 1/2007 | Piehl et al. | | | |
| 2007/0153860 A1 | 7/2007 | Chang-Hasnain et al. | | | |
| 2007/0177247 A1 | 8/2007 | Miles | | | |
| 2007/0253054 A1 | 11/2007 | Miles | | | |
| 2008/0037093 A1 | 2/2008 | Miles | | | |
| 2008/0088904 A1 | 4/2008 | Miles | | | |
| 2008/0088910 A1 | 4/2008 | Miles | | | |
| 2008/0088911 A1 | 4/2008 | Miles | | | |
| 2008/0088912 A1 | 4/2008 | Miles | | | |
| 2008/0106782 A1 | 5/2008 | Miles | | | |
| 2008/0297853 A1 | 12/2008 | Steckl et al. | | | |
| 2009/0068781 A1 | 3/2009 | Tung et al. | | | |
| 2009/0080060 A1 | 3/2009 | Sampsell et al. | | | |
| 2010/0039370 A1 | 2/2010 | Miles | | | |
| 2011/0019380 A1 | 1/2011 | Miles | | | |
| 2011/0026096 A1 | 2/2011 | Miles | | | |
| 2011/0038027 A1 | 2/2011 | Miles | | | |

FOREIGN PATENT DOCUMENTS

| | | |
|---|---|---|
| EP | 0 695 959 | 2/1996 |
| EP | 0 879 991 | 11/1998 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 275 997 | 1/2003 |
| EP | 1 403 212 | 3/2004 |

OTHER PUBLICATIONS

Tolansky, 1948, Chapter II: Multiple-Beam Interference, in Multiple-bean Interferometry of Surfaces and Films, Oxford at the Clarendon Press, pp. 8-11.

Office Action dated Jul. 10, 2009, 2008 in Chinese App. No. 200510103445.3.

Office Action dated Feb. 9, 2009 in U.S. Appl. No. 11/772,730.

Extended European Search Report dated May 4, 2009 in App. No. 05255648.7.

Office Action dated May 9, 2008 in Chinese App. No. 200510103445.3.

Final Notice of Rejection in Japanese App. No. 2005-233651, dated Nov. 10, 2009.

Notice of Reasons for Rejection in Japanese App. No. 2005-233651, dated Aug. 19, 2008.

Pape et al., Characteristics of the deformable mirror device for optical information processing, Optical Engineering, 22(6):676-681, Nov.-Dec. 1983.

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Miles, Interferometric modulation: MOEMS as an enabling technology for high performance reflective displays, Proceedings of SPIE, vol. 4985, pp. 131-139, 2003.

Office Action dated Dec. 26, 2008, 2008 in Chinese App. No. 200510103445.3.

Conner, "Hybrid Color Display Using Optical Interference Filter Array," SID Digest, pp. 577-580 (1993).

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. Conf. 6, Jun. 24, 1991, pp. 372-375.

Miles, Mark, W., "A New Reflective FPD Technology Using Interferometric Modulation", The Proceedings of the Society for Information Display (May 11-16, 1997).

Office Action mailed Feb. 27, 2006 in U.S. Appl. No. 11/057,045.

Office Action mailed Jul. 27, 2006 in U.S. Appl. No. 11/057,045.

Nakagawa et al., Feb. 1, 2002, Wide-field-of-view narrow-band spectral filters based on photonic crystal nanocavities, Optics Letters, 27(3):191-193.

Decision of Rejection dated Sep. 28, 2010 in Chinese App. No. 200510103445.3.

ISR and WO for PCT/US08/068062, filed Jun. 24, 2008.

IPRP for PCT/US08/068062, dated Sep. 23, 2009.

Billard, Tunable Capacitor, 5th Annual Review of LETI, Jun. 24, 2003, p. 7.

Hohlfeld et al., Jun. 2003, Micro-machined tunable optical filters with optimized band-pass spectrum, 12th International Conference on Transducers, Solid-State Sensors, Actuators and Microsystems, 2:1494-1497.

Mehregany et al., 1996, MEMS applications in optical systems, IEEE/LEOS 1996 Summer Topical Meetings, pp. 75-76.

Miles et al, Oct. 21, 1997, A MEMS based interferometric modulator (IMOD) for display applications, Proceedings of Sensors Expo, pp. 281-284.

Nieminen et al., 2004, Design of a temperature-stable RF MEM capacitor, IEEE Journal of Microelectromechanical Systems, 13(5):705-714.

Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.

CONDUCTIVE BUS STRUCTURE FOR INTERFEROMETRIC MODULATOR ARRAY

CLAIM OF PRIORITY

This application is a continuation of U.S. application Ser. No. 11/057,045, filed on Feb. 11, 2005 which claims the benefit of U.S. Provisional Application No. 60/613,372, filed on Sep. 27, 2004, the disclosures of each of which are incorporated herein by reference in their entirety.

BACKGROUND

1. Field of the Invention

The field of the invention relates to microelectromechanical systems (MEMS), and more particularly, to electrical connection architectures for arrays of MEMS elements.

2. Description of the Related Technology

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be partially transparent and capable of relative motion upon application of an appropriate electrical signal. One plate may comprise a stationary layer deposited on a substrate, the other plate may comprise a metallic membrane suspended over the stationary layer.

Arrays of independently actuatable interferometric light modulators are used in certain display configurations as display elements. The light modulators are electrically connected so as to provide the control voltages or signals used to individually actuate each light modulator.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In certain embodiments, a light modulator comprises a substrate, a first electrode layer over the substrate, and a second electrode layer over the substrate. The light modulator further comprises a reflective surface substantially parallel to the first electrode layer and coupled to the second electrode layer. The reflective surface is movable along a direction substantially perpendicular to the reflective surface between a first position and a second position. The first position is a first distance from the first electrode layer and the second position is a second distance from the first electrode layer. The light modulator further comprises a conductive bus layer of which at least a portion is electrically coupled to at least one of the first electrode layer and the second electrode layer. The reflective surface moves between the first position and the second position in response to a voltage applied to the conductive bus layer.

In certain embodiments, a method controls a light modulator. The method comprises providing a substrate and providing a first electrode layer over the substrate. The method further comprises providing a second electrode layer over the substrate and providing a reflective surface that is substantially parallel to the first electrode layer and coupled to the second electrode layer. The reflective surface is movable along a direction substantially perpendicular to the reflective surface between a first position and a second position. The first position is a first distance from the first electrode layer and the second position is a second distance from the first electrode layer. The method further comprises applying a voltage to a conductive bus layer, wherein at least a portion of the conductive bus layer is electrically coupled to at least one of the first electrode layer and the second electrode layer. The method further comprises moving the reflective surface between the first position and the second position in response to the applied voltage.

DETAILED DESCRIPTION OF CERTAIN EMBODIMENTS

An exemplary embodiment of an interferometric light modulator comprises a substrate, a first electrode layer over the substrate, a second electrode layer over the substrate, and a conductive bus layer. At least a portion of the conductive bus layer is electrically coupled to at least one of the first electrode layer and the second electrode layer. The reflective surface moves between the first position and the second position in response to a voltage applied to the conductive bus layer. The conductive bus layer provides an electrical path that has significantly lower electrical resistance than configurations which electrically connect columns of interferometric modulators only through the first electrode layer or connect rows of interferometric modulators only through the second electrode layer.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
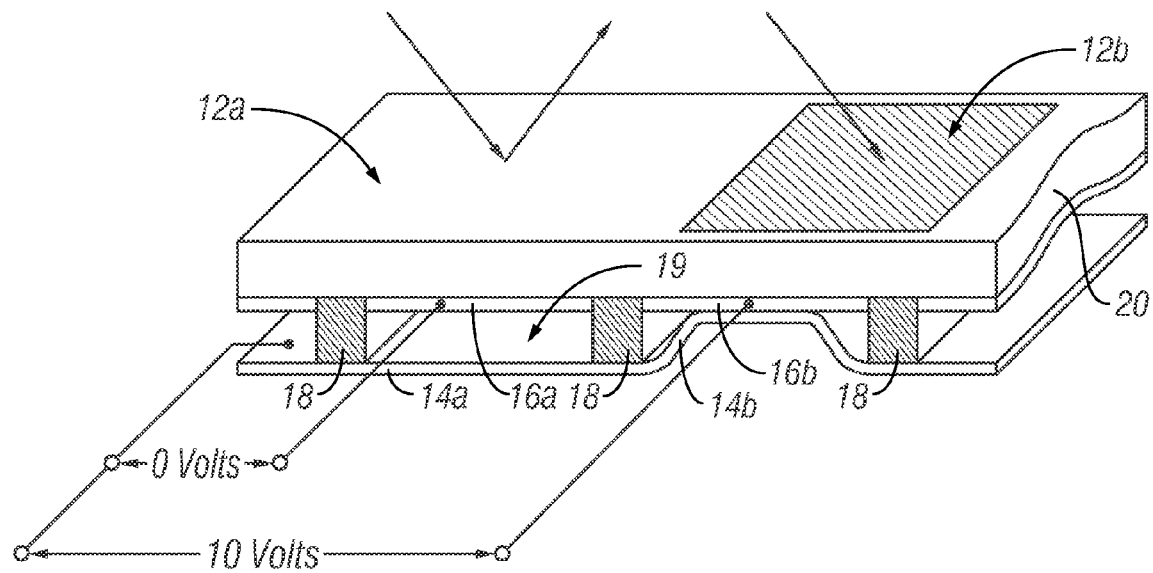
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
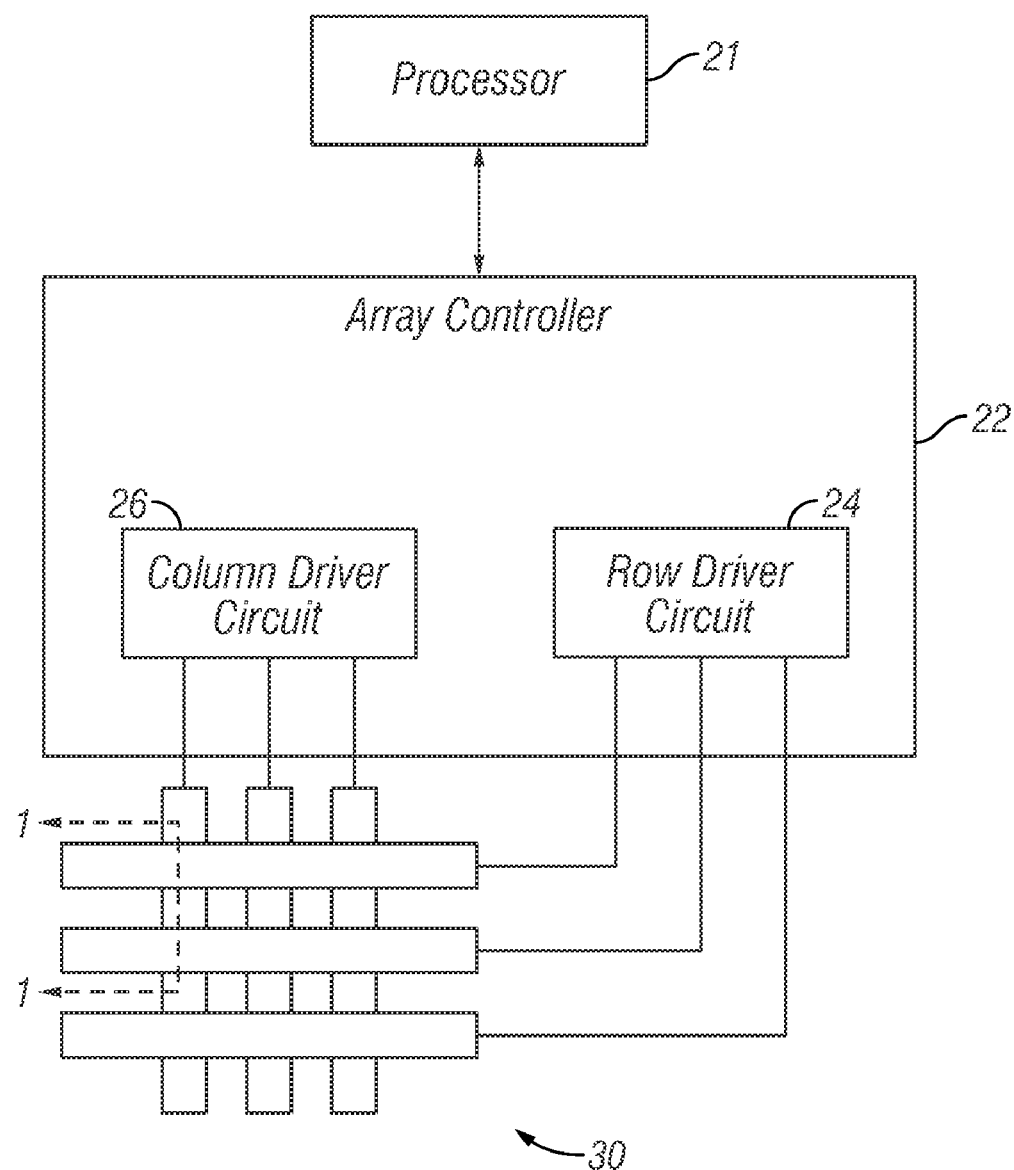
FIG. 2 is a system block diagram illustrating one embodiment of an electronic device incorporating a 3×3 interferometric modulator display.

FIGS. 2 through 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
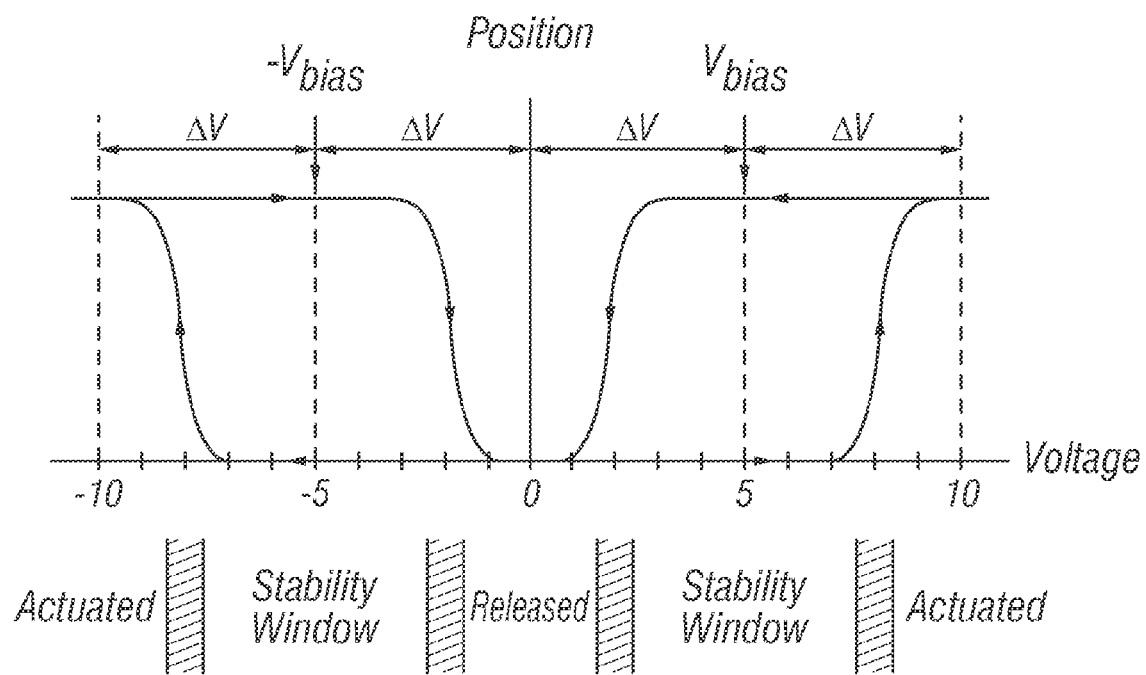
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
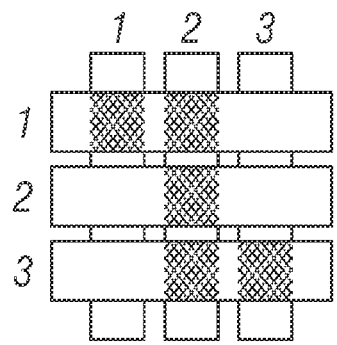
FIGS. 5A and 5B illustrate one exemplary timing diagram for row and column signals that may be used to write a frame of display data to the 3×3 interferometric modulator display of FIG. 3.
Figure 5B:
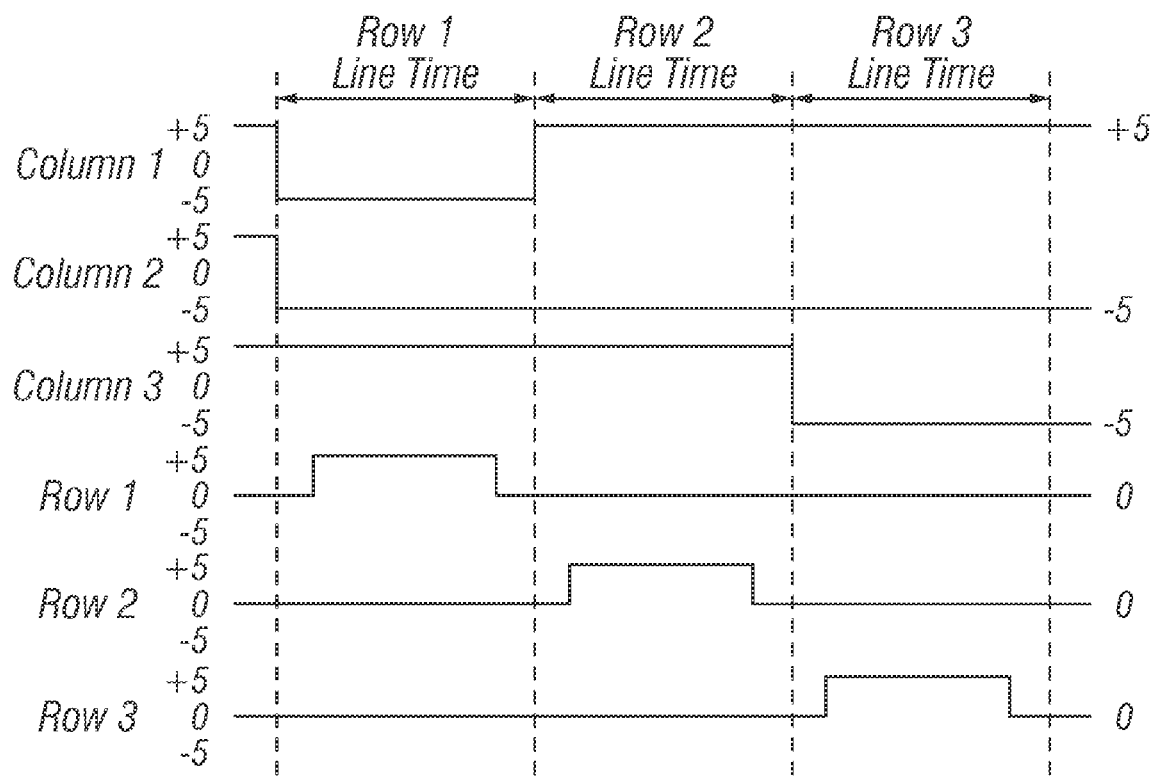

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
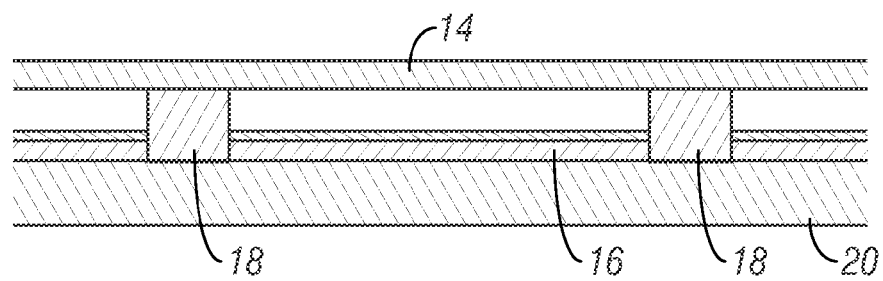
FIG. 6A is a cross section of the device of FIG. 1.
Figure 6B:
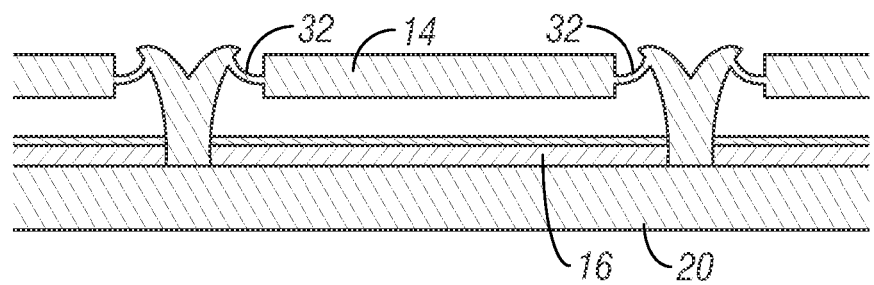
FIG. 6B is a cross section of an alternative embodiment of an interferometric modulator.
Figure 6C:
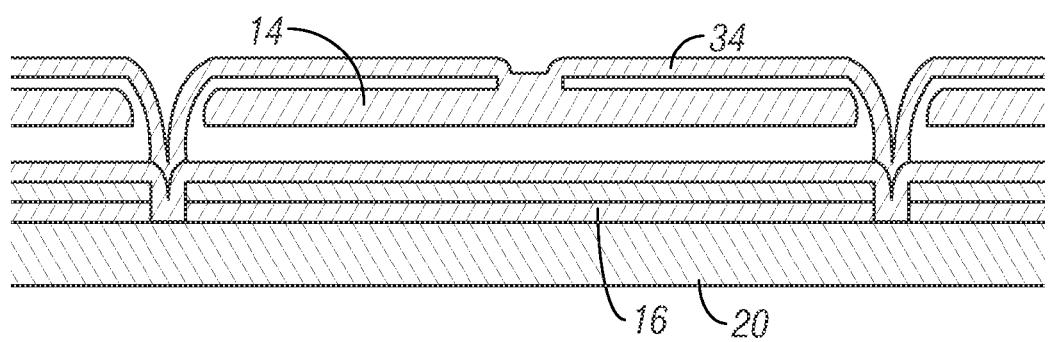
FIG. 6C is a cross section of another alternative embodiment of an interferometric modulator.

The details of the structure of interferometric modulators that operate in accordance with the principles set forth above may vary widely. For example, FIGS. 6A-6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

The response time for discharging and charging an interferometric modulator is dependent in part on an RC (resistance-capacitance) time constant for the voltage circuit connected to the interferometric modulator. This response time of the interferometric modulator has an effect on the display quality of the interferometric modulator array. When the time between incoming scan pulses received by a given interferometric modulator is shorter than the response time of the interferometric modulator, the moving layer is unable to synchronize with the incoming scan pulses. Under such conditions, the state of the interferometric modulator does not respond to each and every scan pulse, thereby resulting in a degraded displayed image. It is therefore desirable to provide an interferometric modulator with a reduced response time to allow for faster scan and refresh rates.

The voltage circuit connected to an interferometric modulator comprises the electrodes of the interferometric modulator, as well as the contacts, conductors, and other conductive elements which provide electrical connections between the electrodes and the row/column driver electronics. In certain embodiments, the materials and geometries of the electrodes of the interferometic modulator impact the RC time constant for the voltage circuit. In certain array configurations, the electrodes of adjacent interferometric modulators are coupled together in series to connect adjacent interferometric modulators with the driver electronics, resulting in higher RC time constants. For other array configurations, wires or other electrical connectors may be utilized for the electrical connections between the row and column drivers and the electrodes of the interferometric modulators, with these wires contributing to the RC time constants of the interferometric modulators.

Figure 7A:
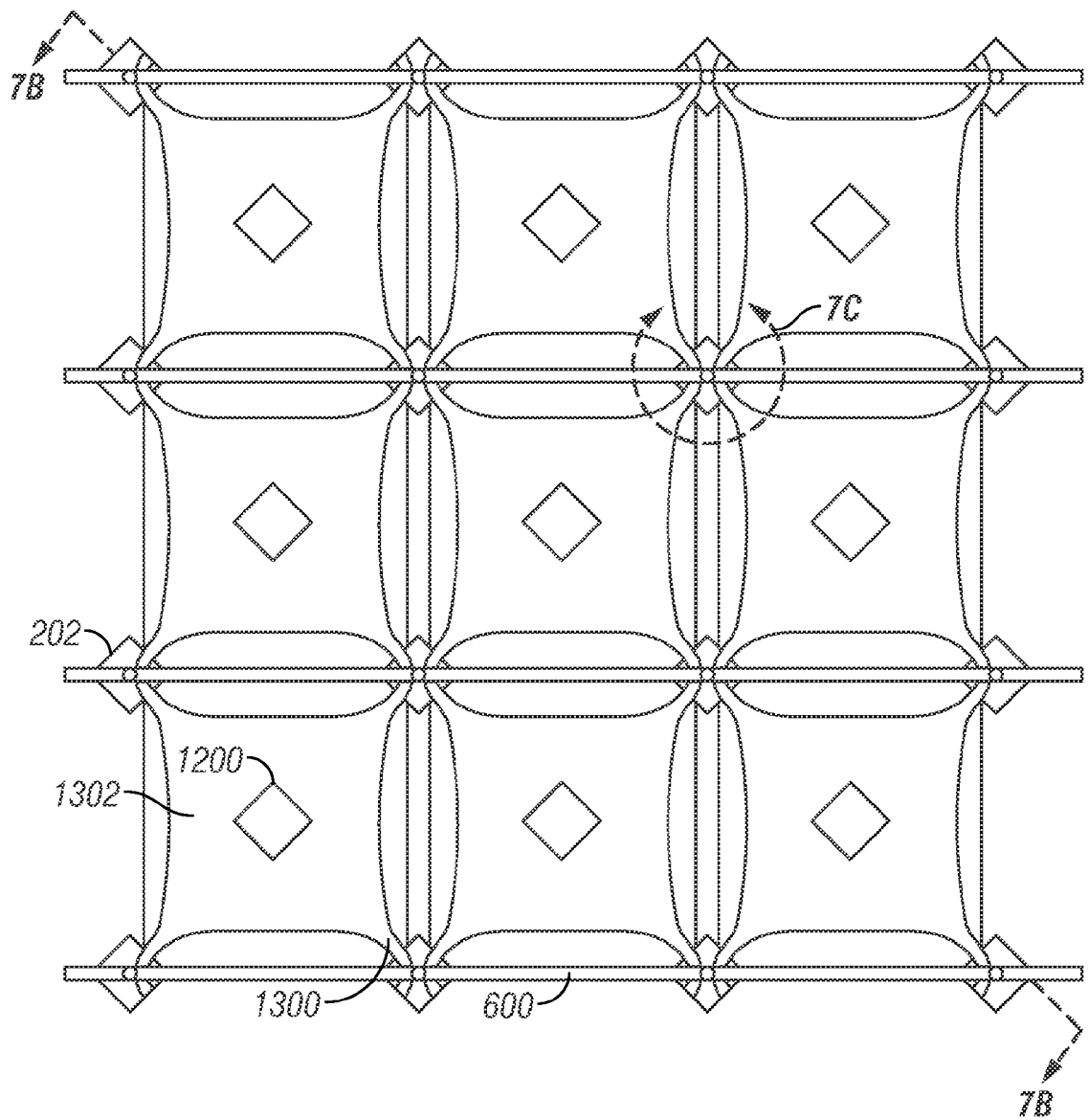
FIG. 7A schematically illustrates an exemplary 3×3 interferometric modulator display having a conductive bus located above the second electrode layer and electrically coupled to the first electrode layer.
Figure 7B:
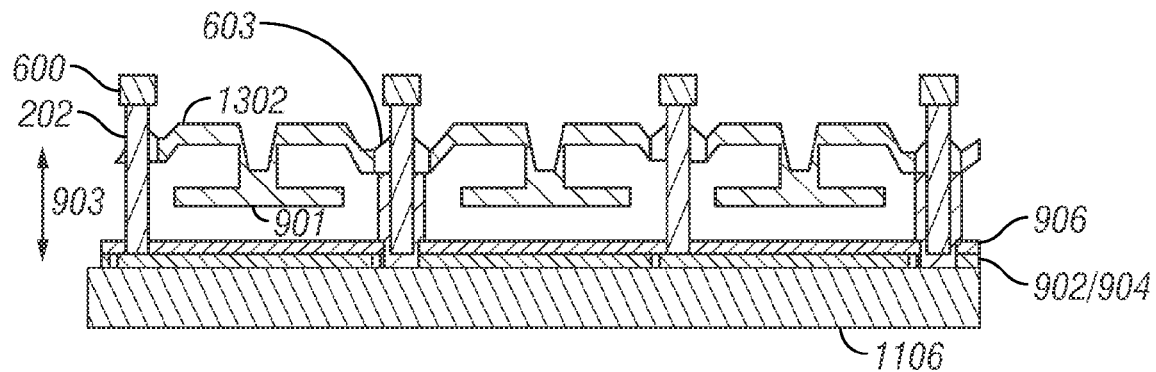
FIG. 7B shows a cross-sectional view of the 3×3 interferometric modulator display of FIG. 7A.
Figure 7C:
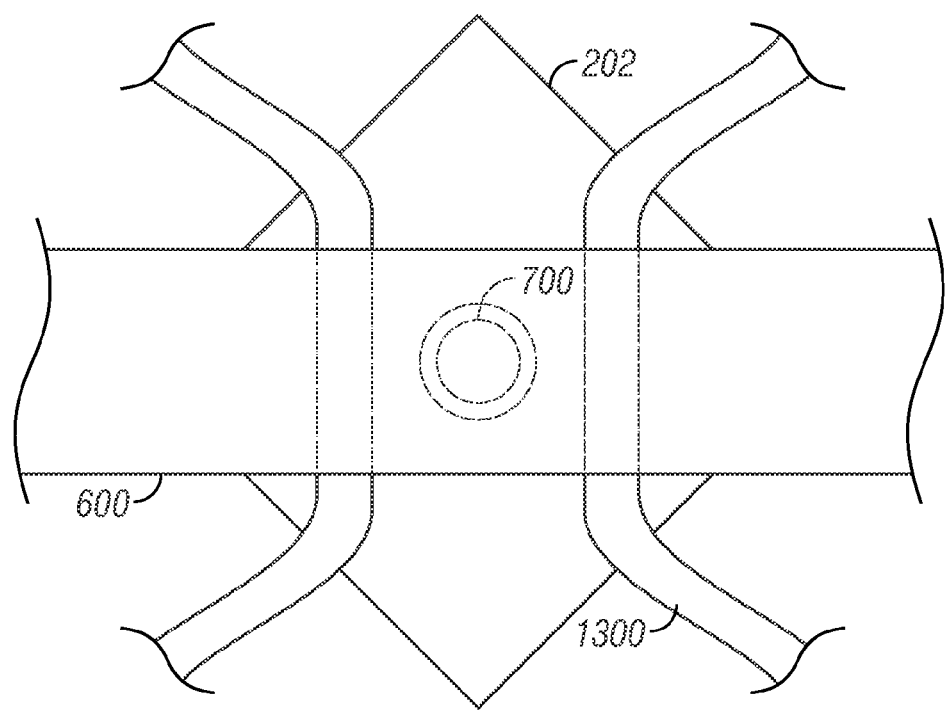
FIG. 7C is a view of a single post support from the 3×3 interferometric modulator display of FIG. 7A with the conductive bus to second electrode layer connection shown in circular dashed lines.

FIGS. 7A, 7B, and 7C schematically illustrate an exemplary 3×3 portion of an interferometric modulator display in accordance with embodiments described herein. Display portions which are larger or smaller than the 3×3 portion illustrated in FIG. 7A are also compatible with embodiments described herein. As shown in the cross-sectional view of FIG. 7B, each modulator comprises a substrate 1106, a first electrode layer 902 over the substrate 1106, and a second electrode layer 1302 over the substrate 1106. The modulator further comprises a reflective surface 901 which is substantially parallel to the first electrode layer 902 and is coupled to the second electrode layer 1302. The reflective surface 901 is movable between a first position and a second position. The first position of the reflective surface 901 is a first distance from the first electrode layer 902. The second position of the reflective surface 901 is a second distance from the first electrode layer 902.

In certain embodiments, as shown in FIG. 7B, the first electrode layer 902 of each modulator is fixed, and is positioned in proximity to the substrate 1106. The first electrode layers 902 of the array are arranged in rows. These rows are not shown in FIG. 7A, but they correspond to the three rows of modulators shown in FIG. 7A. The first electrode layers 902 of each row are electrically connected to one another, but are electrically insulated from the first electrode layers 902 of the other rows.

In certain embodiments, the second electrode layer 1302 of each modulator comprises at least a portion of the moving layer above the first electrode layer 902. In the embodiment schematically illustrated by FIG. 7A, the second electrode layer 1302 comprises the whole moving layer. In certain embodiments, the second electrode layers 1302 of the array are patterned so as to separate the second electrode layers 1302 of each column of modulators from the second electrode layers 1302 of adjacent columns of modulators. Thus, the second electrode layers 1302 of the array are arranged in columns. For example, in the embodiment schematically illustrated by FIG. 7A, the second electrode layers 1302 have straps or tethers 1300 at the four corners of the second electrode layer 1302 of each modulator. The tethers 1300 mechanically couple the second electrode layers 1302 to the support posts 202 at the corners of the modulators. The tethers 1300 also electrically couple the second electrode layers 1302 of adjacent modulators within a column, while the second electrode layers 1302 are electrically insulated from the second electrode layers 1302 of the other columns. Other second electrode layers 1302 compatible with embodiments described herein, have spring structures rather than the tethers 1300 of FIG. 7A.

In certain embodiments, as schematically illustrated by FIGS. 7A and 7B, the reflective surface 901 of each modulator is mechanically coupled to the second electrode layer 1302 of the corresponding modulator by a support member 1200. Certain other embodiments comprise a plurality of support members which mechanically couple the reflective surface 901 to the second electrode layer 1302. Thus, when the modulator is activated, the reflective surface 901 is moved between the first position and the second position relative to the first electrode layer 902 along a direction 903 substantially perpendicular to the reflective surface 901.

In certain embodiments, each modulator of the array further comprises a conductive bus layer. At least a portion of the conductive bus layer is electrically coupled to at least one of the first electrode layer 902 and the second electrode layer 1302. The reflective surface 901 moves between the first position and the second position in response to a voltage applied to the conductive bus layer.

The conductive bus layer 600 of certain embodiments comprises a conductive material, including but not limited to, metals, composites, and alloys. Exemplary conductive materials for the conductive bus layer 600 include, but are not limited to, titanium, chromium, nickel, and aluminum. In certain embodiments, the thickness of the conductive bus layer 600 is in a range between approximately 0.1 micron and approximately 2 microns measured in a direction that is parallel to the direction 903 in FIG. 7B. Other thicknesses are also compatible with embodiments described herein.

In certain embodiments, as shown in FIG. 7A, the conductive bus layer 600 is positioned above the second electrode layer 1302. The conductive bus layers 600 of the modulators form a plurality of conductive bars, which in the exemplary embodiment illustrated in FIG. 7A, are located above the second electrode layers 1302. The conductive bars of each row are electrically connected to one another and electrically insulated from the conductive bars of the other rows. In certain embodiments, each conductive bar provides electrical connections between a row driver and the first electrode layers 902 of a corresponding row of modulators. In certain embodiments, the width of the conductive bars running along the rows is in a range between approximately 4 microns and approximately 10 microns measured in a direction that is perpendicular to the direction 903 in FIG. 7B. Other widths are also compatible with embodiments described herein.

In the exemplary embodiment illustrated in FIGS. 7A-7C, the conductive bus layer 600 of a modulator is electrically coupled to the first electrode layer 902 of the modulator by a conductive portion of one or more of the support posts 202 of the modulator. The support posts 202 provide structural support for the moving layer and the second electrode layer 1302. In certain embodiments, the conductive portions of the support posts 202 are electrically coupled to both the conductive bus layer 600 and the first electrode layer 902, but are electrically insulated from the second electrode layer 1302 by insulating material 603, as shown in FIG. 7B.

FIG. 7C schematically illustrates a support post 202 of the 3×3 portion of the interferometric modulator display of FIG. 7A compatible with embodiments described herein. The tethers 1300 are mechanically coupled to the support post 202, but are electrically insulated from the conductive bus layer 600 and from the electrically conductive portion 700 of the support post 200. The electrically conductive portion 700 of the support post 200 electrically couples the conductive bus layer 600 to the first electrode layer 902. As shown in FIG. 7C, the electrically conductive portion 700 of the support post 200 has a generally circular shape, as illustrated by the concentric dashed lines. In certain other embodiments, the conductive portion 700 has other cross-sectional shapes (e.g., square). In certain embodiments, the conductive portion 700 is tubular, cylindrical, or solid. Embodiments of the conductive portion 700 may have a uniform or non-uniform cross-section between the conductive bus layers 600 and the first electrode layers 902.

Advantageously, for the embodiments schematically illustrated by FIGS. 7A, 7B, and 7C, the conductive bus layer 600 is positioned over the second electrode layer 1302 and away from the optical path of light entering or being reflected from the interferometric modulator. Thus, the conductive bus layer 600 of such embodiments does not interfere with the optical properties of the interferometric modulator. Furthermore, the conductive bus layer 600 advantageously provides an electrical path between the row driver electronics of the interferometric modulator array and the first electrode layer 902 which has significantly lower electrical resistance than do other electrical paths of other configurations (e.g., the first electrode layers 902 of a row of interferometric modulators connected in series with one another), thereby advantageously reducing the RC time constant as compared to these other configurations.

The conductive bus layer 600 of certain embodiments is positioned at various locations relative to the other portions of the display of interferometric modulators. In certain embodiments, as schematically illustrated by FIG. 7A, the conductive bus layer 600 is over the second electrode layer 1302. As described below, in certain other embodiments, the conductive bus layer 600 is positioned within or adjacent to the first electrode layer 902, or between the first electrode layer 902 and the second electrode layer 1302. The conductive bus layer 600 can also be located below the first electrode layer 902, or in substantially the same plane as the second electrode layer 1302. Other configurations of the conductive bus layer 600 are also compatible with embodiments described herein.

Figure 8A:
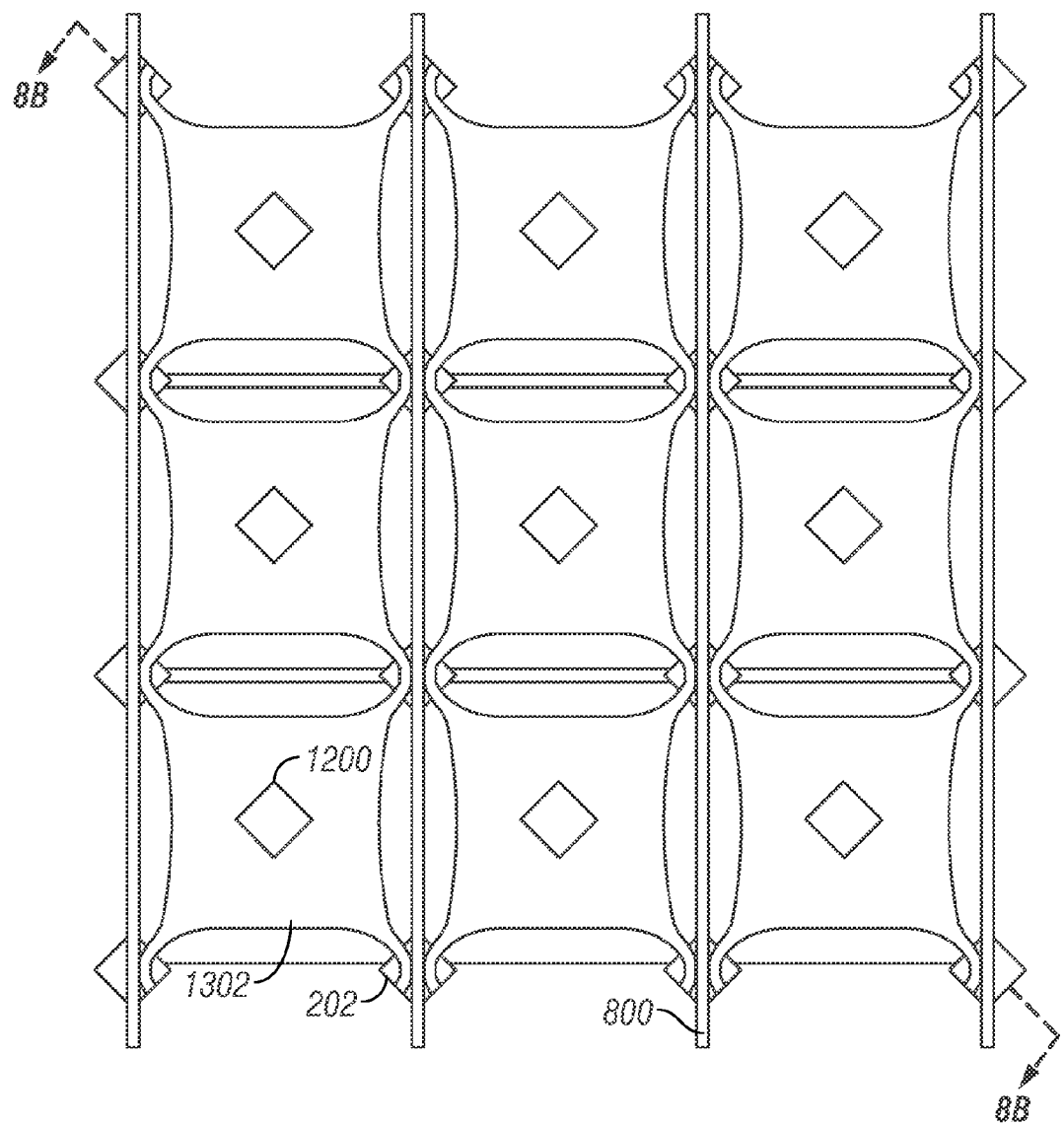
FIG. 8A schematically illustrates an exemplary 3×3 interferometric modulator display having a conductive bus located above the second electrode layer and electrically coupled to the second electrode layer.
Figure 8B:
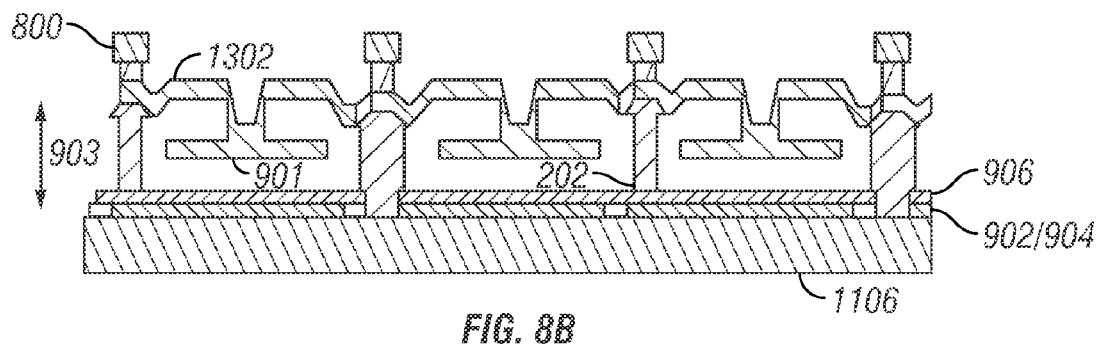
FIG. 8B shows a cross-sectional view of the 3×3 interferometric modulator display of FIG. 8B.

FIG. 8A schematically illustrates an exemplary 3×3 portion of an interferometric modulator display having interferometric modulators in which the conductive bus layer 800 is located above the second electrode layer 1302 and is electrically coupled to the second electrode layer 1302. FIG. 8B shows a cross-sectional view of the 3×3 portion of the interferometric modulator display of FIG. 8A. In certain embodiments, as shown in FIG. 8A, the conductive bus layers 800 of a column of modulators of the display are coupled together to form a plurality of conductive bars. The conductive bar of each column electrically connects the second electrode layers 1302 of the column to one another, and the conductive bar of each column is electrically insulated from the conductive bars of the other columns.

In certain embodiments, each conductive bar provides electrical connections between a column driver and the second electrode layers 1302 of the corresponding column of modulators. In certain embodiments, each conductive bus layer 800 is electrically connected to the corresponding second electrode layers 1302 at one or more locations. As illustrated in FIG. 8B, the conductive bus layer 800 is connected to the second electrode layer 1302 over the support posts 202. In certain embodiments, the width of the conductive bars running along the columns is in a range between approximately 4 microns and approximately 10 microns measured in a direction that is perpendicular to the direction 903 in FIG. 8B. Other widths are also compatible with embodiments described herein. Advantageously, the conductive bus layer 800 provides an electrical path between the column driver electronics of the interferometric modulator array which has significantly lower electrical resistance than do other electrical paths of other configurations (e.g., the second electrode layers 1302 of a column of interferometric modulators connected in series with one another), thereby advantageously reducing the RC time constant as compared to other configurations.

Figure 9A:
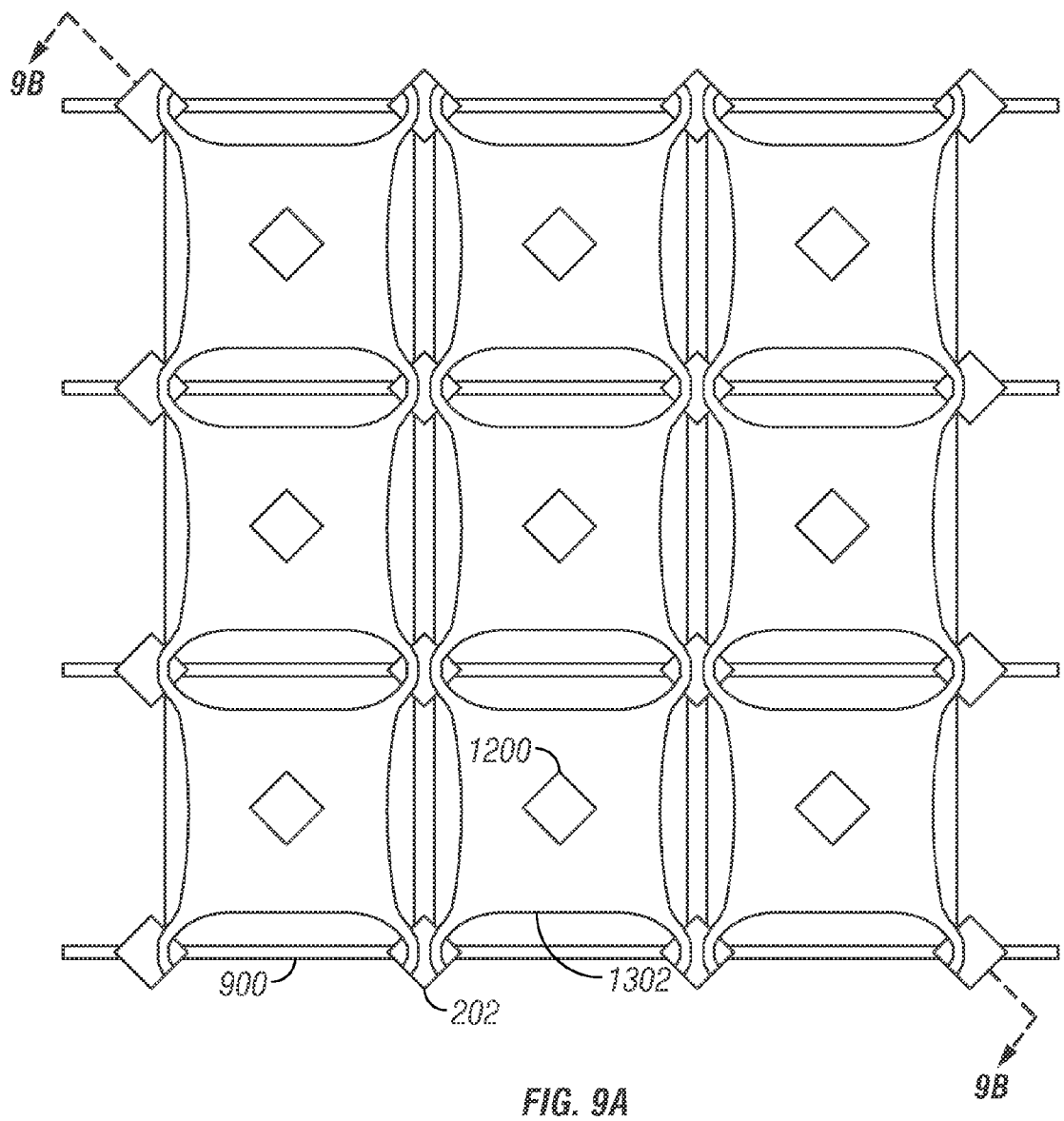
FIG. 9A schematically illustrates an exemplary 3×3 interferometric modulator display having a conductive bus located between the second electrode layer and the first electrode layer and electrically coupled to the first electrode layer.
Figure 9B:
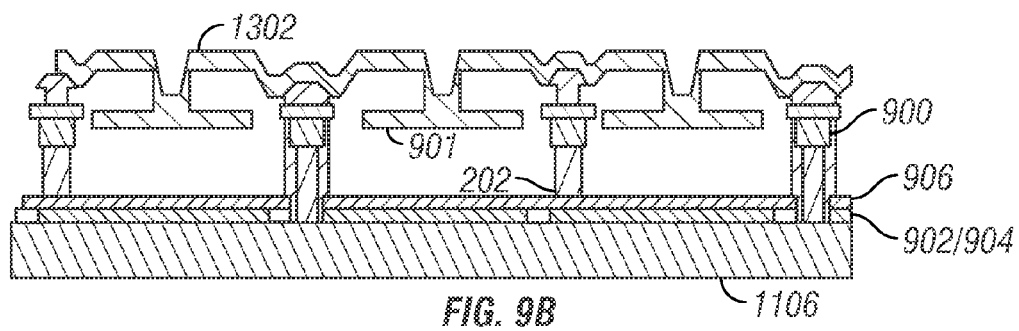
FIG. 9B shows a cross-sectional view of the 3×3 interferometric modulator display of FIG. 9A.

FIG. 9A schematically illustrates an exemplary 3×3 portion of an interferometric modulator display having interferometric modulators in which the conductive bus layer 900 is located between the first electrode layer 902 and the second electrode layer 1302. FIG. 9B shows a cross-sectional view of the 3×3 portion of the interferometric modulator display of FIG. 9A. In the exemplary embodiment illustrated in FIG. 9A, the conductive bus layer 900 is located below the second electrode layer 1302 and is a conductive portion of the support posts 202. In the embodiment schematically illustrated by FIG. 9B, each conductive bus layer 900 is electrically coupled to each first electrode layer 902 of a row of interferometric modulators and is electrically isolated from the first electrode layers 902 of the other rows of interferometric modulators.

The conductive bus layer 900 of certain such embodiments electrically connects a row driver and the first electrode layers 902 of a corresponding row of interferometric modulators. The row driver selectively applies voltages through the conductive bus layer 900 to the first electrode layers 902 of the interferometric modulators of a row of the display. The conductive bus layer 900 provides an electrical path that has significantly lower electrical resistance than configurations which electrically connect rows of interferometric modulators only through the first electrode layers 902.

Figure 9C:
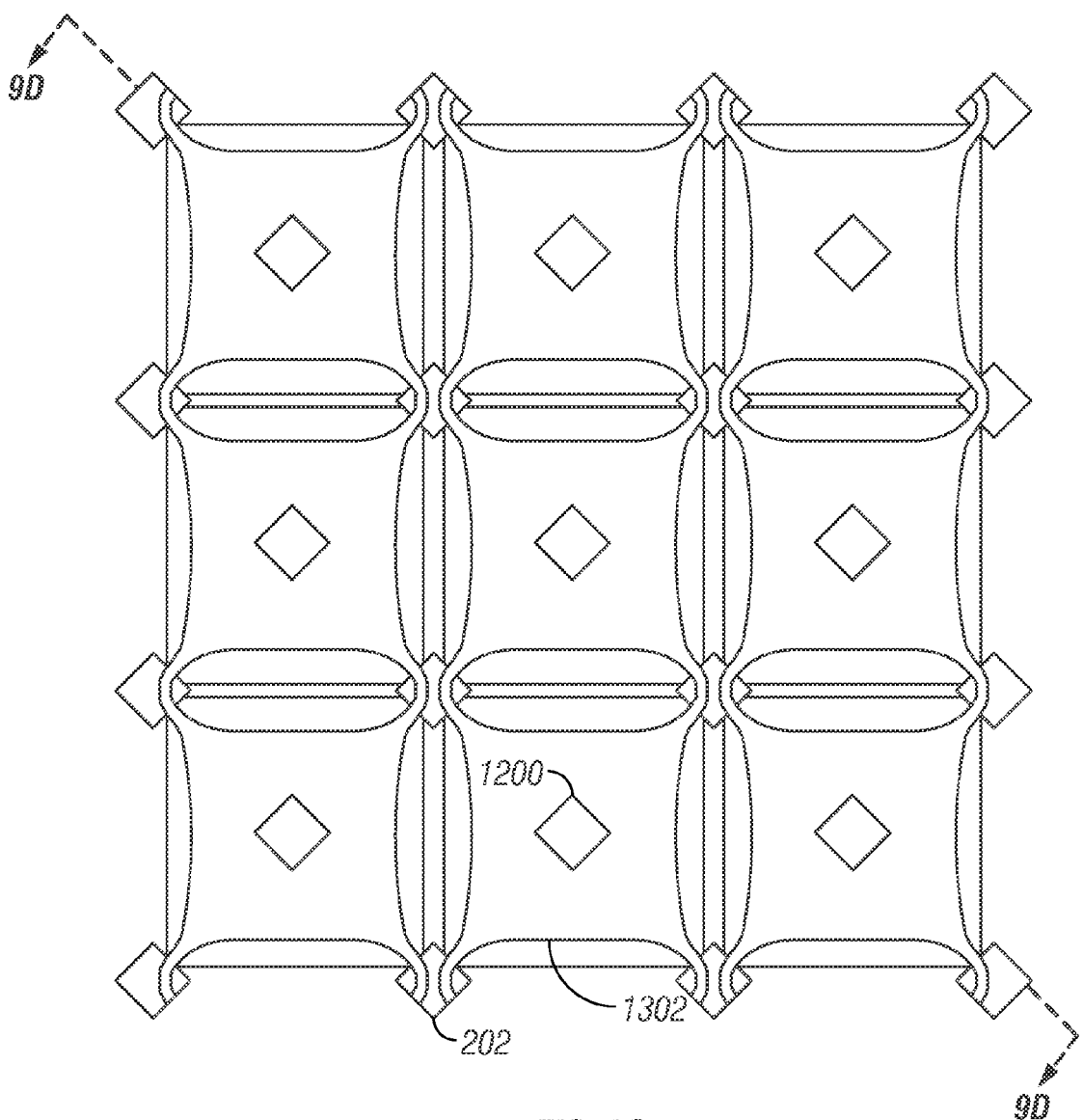
FIG. 9C schematically illustrates an exemplary 3×3 interferometric modulator display having a conductive bus located on and electrically coupled to the first electrode layer.
Figure 9D:
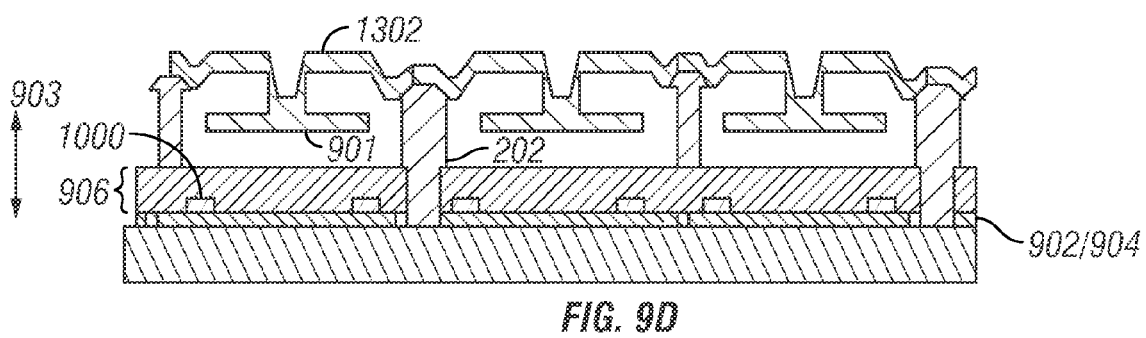
FIG. 9D shows a cross-sectional view of the 3×3 interferometric modulator display of FIG. 9C.

FIG. 9C schematically illustrates an exemplary 3×3 portion of an interferometric modulator display having interferometric modulators with a conductive bus layer 1000 located adjacent to and electrically coupled to the first electrode layers 902 of a corresponding row of interferometric modulators. FIG. 9D shows a cross-sectional view of the 3×3 portion of the interferometric modulator display of FIG. 9C. The conductive bus layer 1000 of certain such embodiments electrically connects a row driver and the first electrode layers 902 of a corresponding row of interferometric modulators, thereby providing an electrical path between the row driver and the interferometric modulator that has significantly lower electrical resistance than other configurations which electrically connect rows of interferometric modulators only through the first electrode layers 902. In the exemplary embodiment illustrated in FIG. 9D, the conductive bus layer 1000 is positioned between the support posts 202 and near the periphery of an underlying first electrode layer 902. The conductive bus layer 1000 is electrically coupled to the underlying first electrode layer 902.

The material for the conductive bus layer 1000 is selected to enhance the conductivity across the first electrode layers 902. In certain embodiments, the conductive bus layer 1000 comprises aluminum or other conductive material. Unlike the first electrode layers 902 of certain embodiments, the material selected for the conductive bus layer 1000 may be opaque. In certain embodiments, the conductive bus layer 1000 has a width in a range between approximately 4 microns and approximately 10 microns measured in a direction that is perpendicular to the direction 903 in FIG. 9D.

In certain embodiments, a dielectric layer 906 is located between the conductive bus layer 1000 and the reflective surface layers 901. The dielectric layer 906 of certain such embodiments advantageously prevents contact between the conductive bus layer 1000 and the reflective surface layer 901 of the interferometric modulator.

In certain embodiments, locating the conductive bus layer 1000 below the reflective surface layer 901 may adversely impact the optical performance of the interferometric modulator by blocking at least a portion of the incoming and reflected light of the interferometric modulator. To reduce the visual impact of the conductive bus layer 1000 on the optical performance of the interferometric modulator, conductive bus layers 1000 with smaller widths measured in a direction that is perpendicular to the direction 903 in FIG. 9D can be utilized.

Figure 9E:
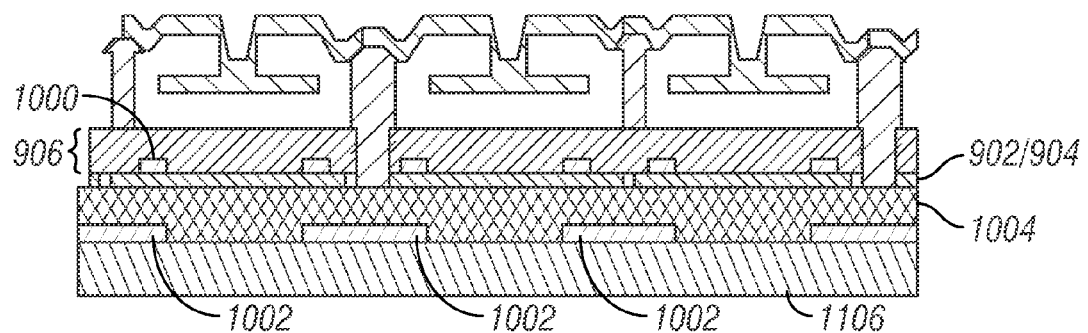
FIG. 9E shows a cross-sectional view of another embodiment of the 3×3 interferometric modulator display of FIG. 9C having a mask material aligned with the conductive bus and located between the conductive bus and the viewing side of the 3×3 interferometric modulator display.

FIG. 9E shows a cross-sectional view of another embodiment of the 3×3 portion of the interferometric modulator display of FIG. 9C. The interferometric modulators of the display illustrated by FIG. 9E have a mask material 1002 generally aligned with the conductive bus layers 1000 of the interferometric modulators and located between the conductive bus layers 1000 and the viewing side of the 3×3 interferometric modulator display. The mask material 1002 is a generally opaque and optically absorbing material with a sufficient width to block incoming light from impinging onto the conductive bus layers 1000. In the embodiment illustrated in FIG. 9E, the mask material 1002 is a generally coplanar in a layer 1004 with an optically transmittive material (e.g., $SiO_2$) which transmits incoming light to the modulators and reflected light from the modulators.

Figure 10A:
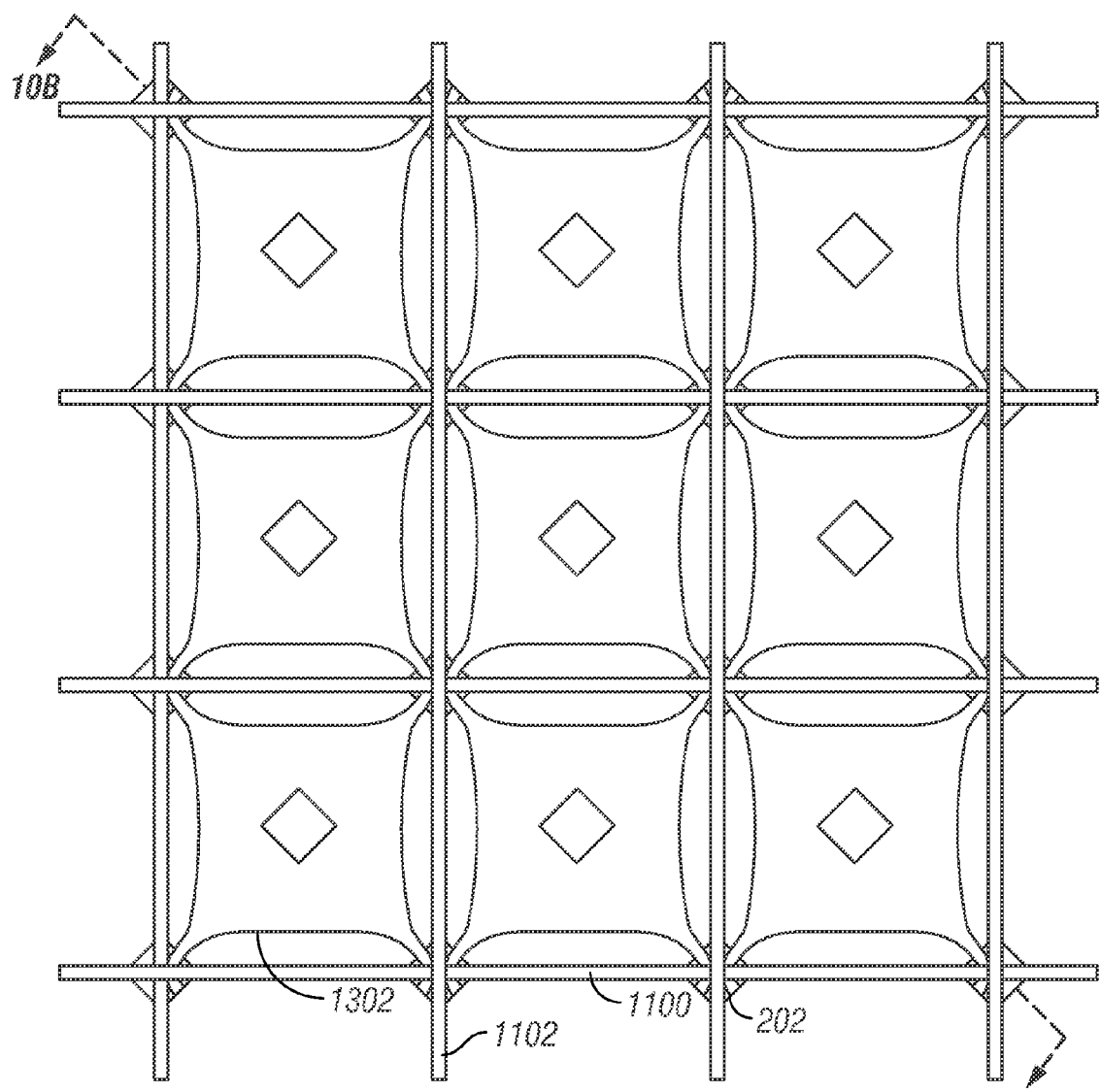
FIG. 10A schematically illustrates an exemplary 3×3 interferometric modulator display having a first conductive bus located above the second electrode layer and electrically coupled to the first electrode layer and a second conductive bus located above the first conductive bus and electrically coupled to the second electrode layer.
Figure 10B:
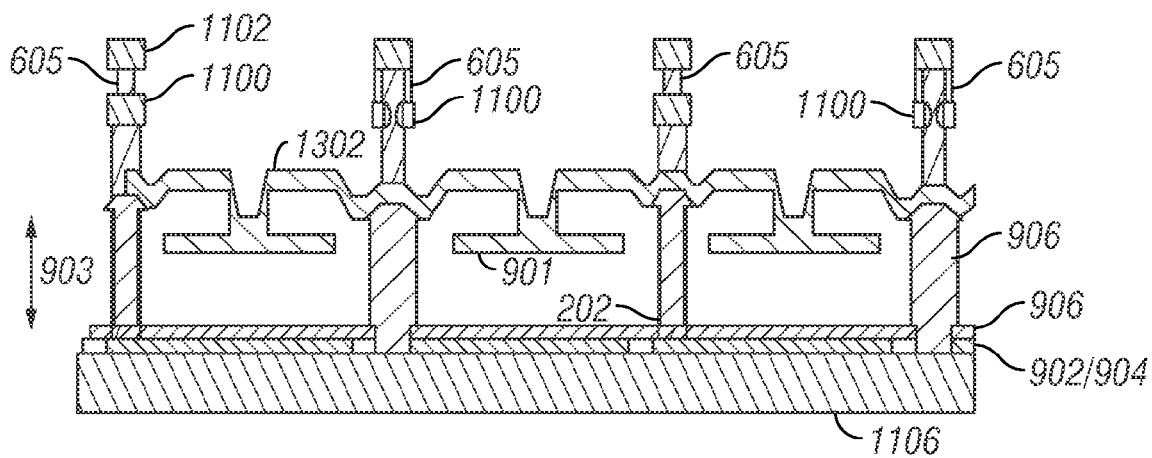
FIG. 10B shows a cross-sectional view of the 3×3 interferometric modulator display of FIG. 10A.

FIG. 10A schematically illustrates an exemplary 3×3 portion of an interferometric modulator display having interferometric modulators with a first conductive bus layer 1100 located over the second electrode layer 1302 and a second conductive bus layer 1102 located over the first conductive bus layer 1100. FIG. 10B shows a cross-sectional view of the 3×3 interferometric modulator display of FIG. 10A. The first conductive bus layer 1100 is electrically coupled through a conductive portion of at least one support post 202 to the first electrode layers 902 of a row of interferometric modulators. The second conductive bus layer 1102 is electrically coupled to the second electrode layers 1302 of a column of interferometric modulators. The first conductive bus layer 1100 is electrically isolated from the second conductive bus layer 1102 via insulating portions 605 of the support posts 202.

In FIG. 10B, the first conductive bus layer 1100 is electrically coupled to the first electrode layer 902 through a conductive portion of one or more support posts 202. The second conductive bus layer 1102 is electrically coupled to the second electrode layer 1302 at locations over one or more support posts 202.

In certain embodiments, the lower resistance path provided by the conductive bus layers advantageously reduces the RC time constant of the circuit. Exemplary RC times for a plurality of interferometric modulators having their first electrode layers 902 electrically coupled in series can range from 5 microseconds to 100 microseconds, depending on the number of interferometric modulators. This same plurality of interferometric modulators may have a resistance of as high as 30-50 ohms/square. The use of the conductive bus layers to electrically connect row and column drivers to the corresponding first electrode layers 902 and second electrode layers 1302 of the plurality of interferometric modulators can reduce the electrical resistance of the circuit, thereby reducing the RC time constant.

Method of Manufacture Conductive Bus Over the Mechanical Layer

Figure 11A:
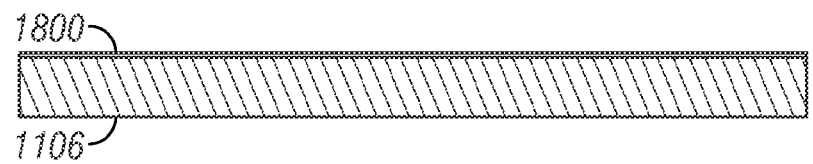
FIGS. 11(A)-11(Q) schematically illustrate an exemplary series of processing steps for forming a conductive bus structure above the second electrode layer.
Figure 11B:
Figure 11C:
Figure 11D:
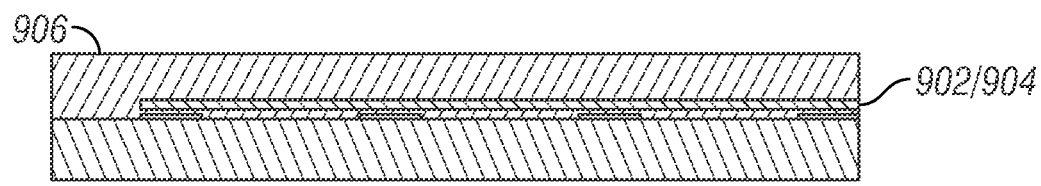
Figure 11E:
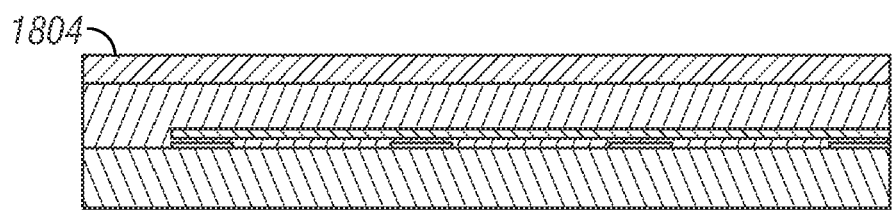
Figure 11F:
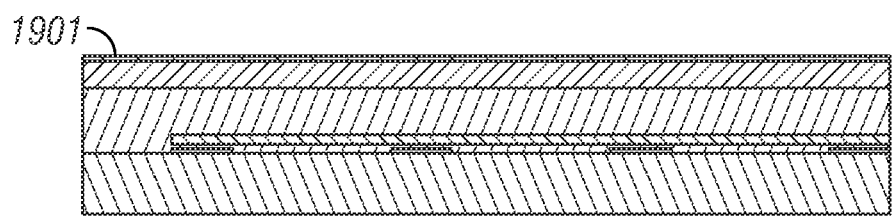
Figure 11G:
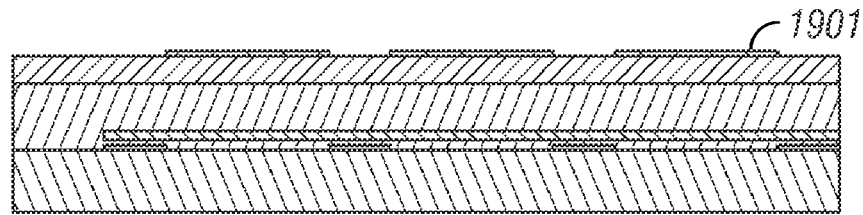
Figure 11H:
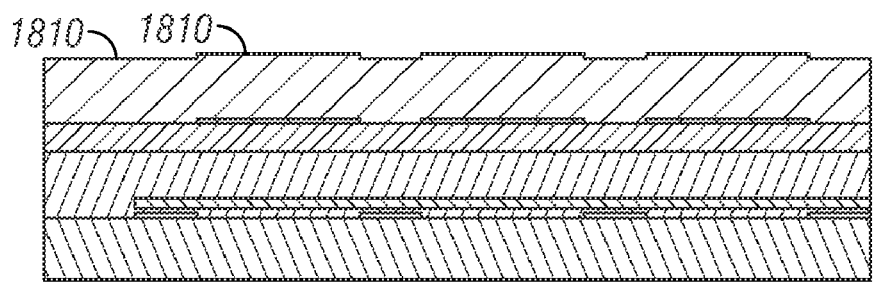
Figure 11I:
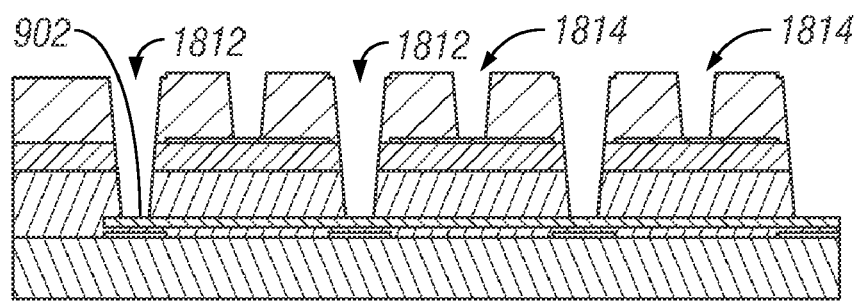
Figure 11J:
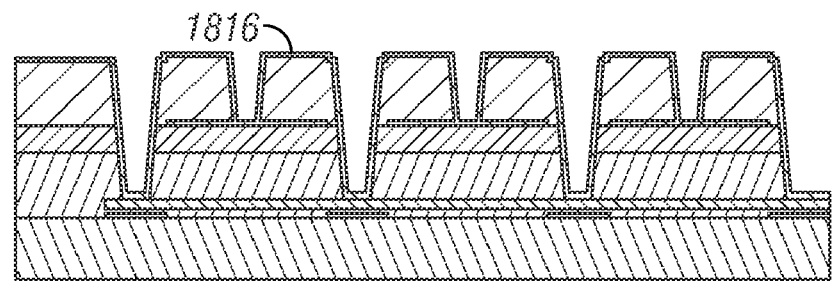
Figure 11K:
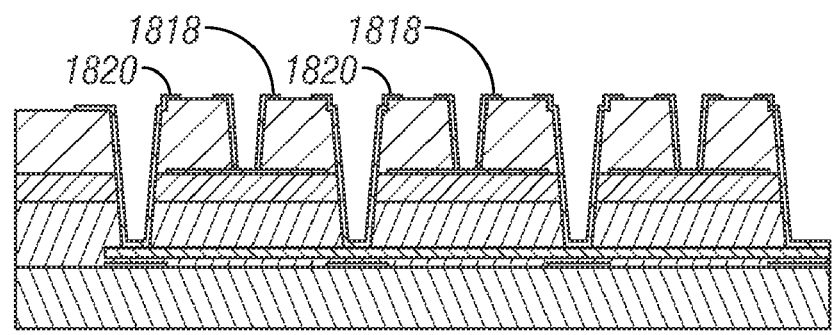
Figure 11L:
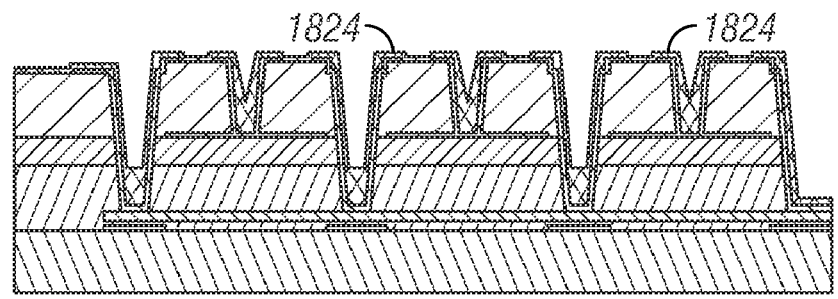
Figure 11M:
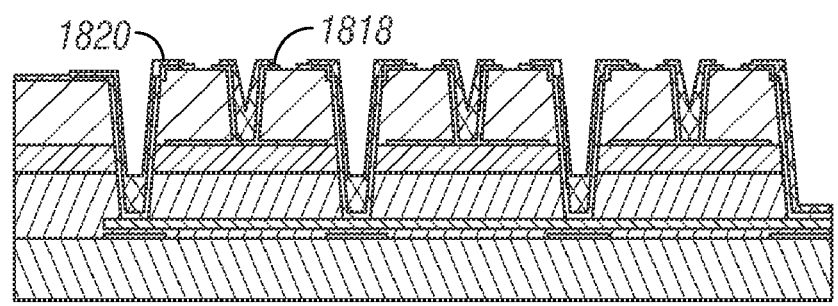
Figure 11N:
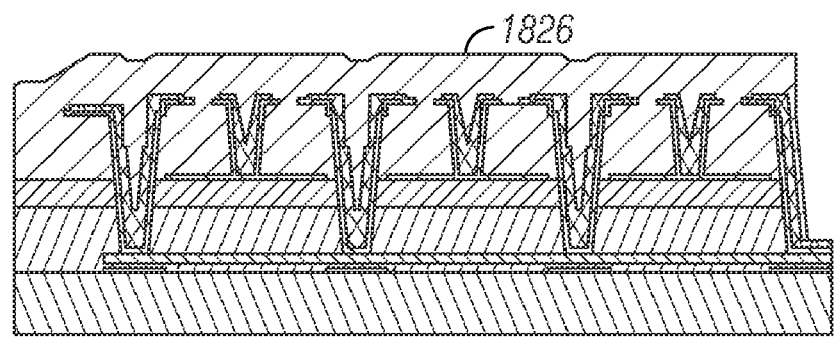
Figure 11O:
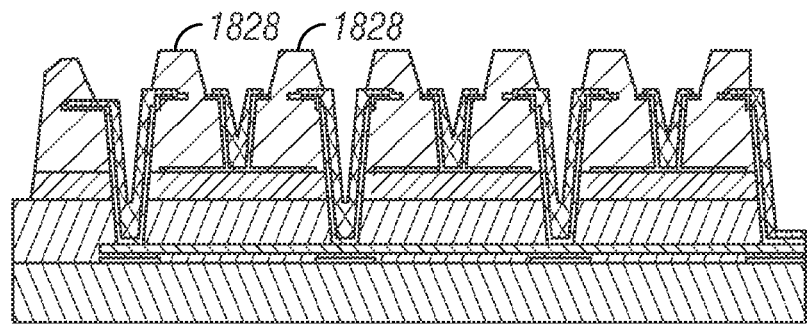
Figure 11P:
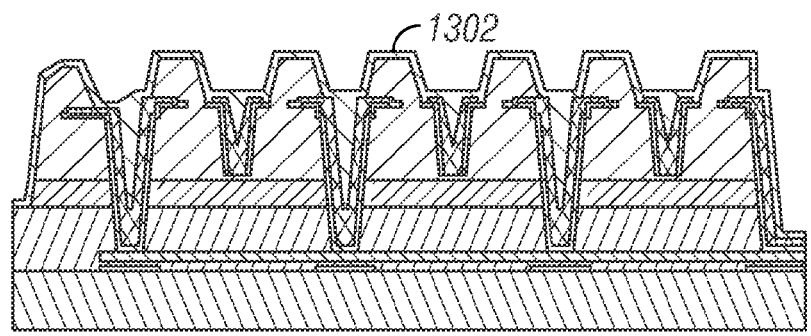
Figure 11Q:
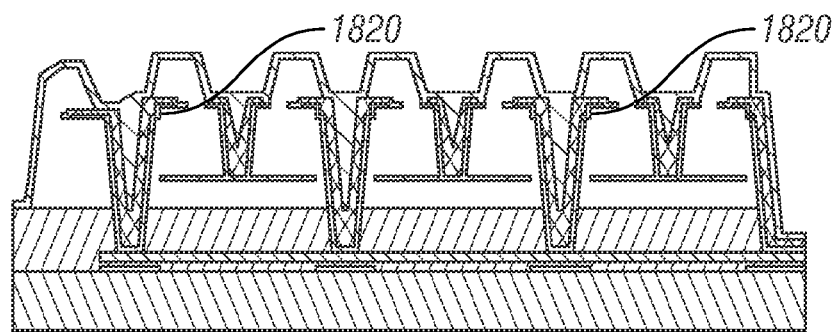

An exemplary series of processing steps for forming a conductive bus structure located above a second electrode layer 1302 is schematically illustrated in FIGS. 11(A)-11(Q). FIG. 11(A) shows the deposit of a black mask 1800 over a substrate 1106. In certain embodiments, the black mask 1800 comprises molybdenum.

FIG. 11(B) shows the black mask 1800 patterned and etched to form islands on top of the substrate 1106. FIG. 11(C) shows the deposit of an oxide layer 1802 over the black mask 1800 and the substrate 1106, and the deposition of a metal layer 904 and a first electrode layer 902 over the oxide layer 1802. In certain embodiments, the metal layer 904 comprises chromium and the first electrode layer 902 comprises indium-tin-oxide (ITO).

FIG. 11(D) show the first electrode layer 902 and the metal layer 904 being patterned and etched to form electrodes and interferometric modulators compatible with columns, rows, or other useful configurations in accordance with the display design. In the exemplary embodiment illustrated in FIGS. 11(A)-11(Q), the first electrode layer 902 is usable as a column electrode.

A dielectric (e.g., silicon oxide) layer 906 is formed over the metal layer 904, the first electrode layer 902, and the oxide layer 1802, as illustrated in FIG. 11(D).

FIG. 11(E) shows the formation of a sacrificial layer 1804. The sacrificial layer 1804 determines the dimension of the cavity over which the reflective surface 901 is suspended. The interference properties of the cavities are directly affected by their depth. Certain embodiments having color interferometric modulators construct modulators having cavities of differing depths which provide the resultant quiescent colors of red, green and blue. To produce these varying cavity dimensions, a different thickness of the sacrificial layer 1804 is deposited for each of the different colored interferometric modulators.

For example, in certain embodiments, a first sacrificial layer is deposited, masked and patterned, with the first sacrificial layer defining the area of a first modulator. A second sacrificial layer is then be deposited and patterned to define the combined area of the first modulator defined above and a second modulator. The combined thicknesses of the first sacrificial layer and the second sacrificial layer in the area of the first interferometric modulator is larger than the thickness of the second sacrificial layer in the area of the second interferometric modulator. Subsequently, in certain embodiments, a third sacrificial layer is formed over the second sacrificial layer defining the combined area of the first, second, and third interferometric modulator for each set of colored interferometric modulators. This third sacrificial layer need not be patterned in certain embodiments, since its thickness will be included in all three of the modulators of the set of colored interferometric modulators.

The three individual sacrificial layers described here may be of different thicknesses. In this way, the first modulator of the set of colored interferometric modulators would have a cavity depth equal to the combined thicknesses of the three sacrificial layers. The second modulator of the set of colored interferometric modulators would have a cavity depth equal to the combined thicknesses of two of the three sacrificial layers. The third modulator of the set of colored interferometric modulators would have a cavity depth equal to the thickness of one of the three sacrificial layers. When the sacrificial layers are removed, the cavity dimensions will vary according to the various combined thicknesses of the three sacrificial layers, resulting in three different colors such as red, green and blue.

FIG. 11(F) illustrates the deposition of a reflective surface layer 1901 over the dielectric layer 906. In FIG. 11(G), the reflective surface layer 1901 was patterned and etched to form islands of the reflective surface layer 1901.

FIG. 11(H) illustrates the deposition of a sacrificial layer 1810 over the reflective surface layer 1901 and the dielectric layer 906. In certain embodiments, the sacrificial layer 1810 comprises molybdenum.

In FIG. 11(I) the sacrificial layer 1810 has been patterned and etched to form conductive bus holes 1812 and reflective surface layer holes 1814. The conductive bus holes 1812 extend through the sacrificial layer 1810 and intervening layers to the first electrode layer 902. The reflective surface layer holes 1814 extend through the sacrificial layer 1810 to the reflective surface layer 1901.

In FIG. 11(J), a conductive layer 1816 is deposited over the sacrificial layer 1810 and in the conductive bus holes 1812 and the reflective surface layer holes 1814. The conductive layer 1816 is electrically coupled to the first electrode layer 902 through the conductive bus holes 1812. The conductive layer 1816 is also electrically coupled to the reflective surface layer 1901 through the reflective surface layer holes 1814.

In FIG. 11(K), the conductive layer 1816 is patterned and etched to form a conductive bus structure 1820 and reflective surface layer connectors 1818. The reflective surface layer connectors 1818 illustrated in FIG. 11(K) are electrically isolated from the conductive bus structure 1820.

In FIG. 11(L), a dielectric layer 1824 is deposited. In FIG. 11(M), the dielectric layer 1824 is patterned and etched to remove portions of the dielectric layer 1824 in regions located between the conductive bus structure 1820 and the reflective surface layer connectors 1818.

FIG. 11(N) illustrates the deposition of a sacrificial layer 1826. In FIG. 11(O), the sacrificial layer 1826 is patterned and etched to form landings 1828 for a second electrode layer 1302. In FIG. 11(P), the second electrode layer 1302 has been deposited, patterned, and etched. In FIG. 11(Q), the sacrificial layers 1804, 1810, 1826 are removed, resulting in the interferometric modulator having the bus structure 1820.

Alone, or in combination with the features described above, the capacitance of the interferometric modulators can be reduced. Reducing the capacitance of the circuit reduces the RC time constant.

Refresh Rate

The time required to charge and discharge or change the applied voltage across the first electrode layer 902 and the second electrode layer 1302 affects the refresh rate of the display. For example, a decrease in the reaction time of the second electrode layer 1302 to changes in the applied voltage allows the display to refresh in less time. A faster refreshing display can provide a less noticeable transition between subsequent frames.

Image Resolution

In certain embodiments, the use of a conductive bus structure comprising complex routing lines along the backside of an array of interferometric modulators improves gray scale display techniques. Techniques for displaying a gray scale image include the subdividing of pixels into a plurality of interferometric modules or smaller sub-pixels. By having more sub-pixels in each pixel, deeper grayscales can be achieved. However, increasing the number of sub-pixels increases the complexity of the required routing to the row and column drivers located at the perimeter of the display array.

In certain embodiments, the use of a conductive bus structure improves the gray scale display. In temporal modulation, each interferometric modulator of a grayscale image is pulsed or rapidly refreshed so that the viewer perceives the display to be exhibiting variations in intensity level. In certain embodiments, the refresh or modulation rate of the interferometric modulator is increased with the incorporation of one or more of the modifications described above. The refresh rate can be calculated by the following calculation:

$$T\_line = T\_rc + T\_\text{interferometric modulator}$$

where T_line is the time to update 1 line;
T_rc is the RC time for the line;
T_interferometric modulator is the mechanical response time of the interferometric modulator.

Then:

$$T\_refresh = n\_rows \times T\_line$$

where T_refresh is the time it takes to update the entire screen; n_rows is the number of rows on the display
Then:

$$\text{Screen Refresh Rate} = 1/T\_refresh$$

where Screen Refresh Rate is the update rate of the entire display, typically in Hz.

Thus, as T_rc is decreased with the use of the conductive bus, T_line decreases and T_refresh decreases. As T_refresh decreases, the Screen Refresh Rate increases and enhances temporal modulation.

Referring back to FIGS. 7A and 7B, the first electrode layer 902 has an intrinsic conductivity depending on the material selected for the first electrode layer 902. The electrical circuit resistance of the interferometric modulator can be reduced by utilizing a material for the first electrode 902 that has a higher conductivity. In certain embodiments, the material selected for the first electrode layer 902 comprises zinc tin oxide (ZnTO) which has a higher conductivity as compared to indium tin oxide (ITO).

The thickness of the first electrode layer 902 may vary. In certain embodiments, the thickness may be between 300 angstroms and 2,000 angstroms measured in a direction that is parallel to the direction 903 in FIG. 7B. Other thicknesses of the first electrode layer 902 may be used.

A material with a low dielectric constant can be selected for the oxide layer or dielectric material 906 that separates the first electrode layer 902 from the second electrode layer 1302. The dielectric electrically insulates the second electrode layer 1302 from the first electrode layer 902 allowing a charge or voltage to be stored between the first and second electrode layers. The dielectric layer 906 further allows the voltage or charge to form an electro-static force that acts upon the second electrode layer 1302. A material having a low dielectric constant advantageously reduces the RC time constant of the electrical circuit. For example, a low dielectric constant (K) material can have a lower dielectric constant than a dielectric made from silicon dioxide (3.8). In certain embodiments, the dielectric constant of the dielectric layer 906 is as low as 2.0.

Reduce Capacitance

Different and additional materials can be added to reduce the capacitance of the electrical circuit. In certain embodiments, the material selected for the dielectric layer 906 can reduce the capacitance of the electrical circuit. These materials include spun-on-glass, SiN, $SiO_2$, $AlO_2$, and composites of one or more of these materials.

Figure 12:
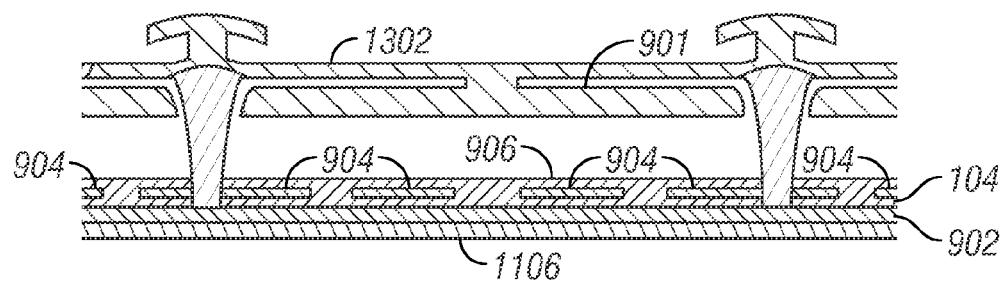
FIG. 12 shows a cross-sectional view of an embodiment of an interferometric modulator having an additional dielectric layer located within the optical stack layer.

In certain embodiments, a second dielectric layer 104 is provided between the metal layer 904 and the first electrode layer 902. In certain embodiments, as illustrated in FIG. 12, the second dielectric layer 104 is located between the metal layer 904 and the first electrode layer 902. This added dielectric layer 104 is in addition to the dielectric or oxide layer 906. In such embodiments, the dielectric layer 104 separates the optical functions of the metal layer 904 from the electrical functions of the first electrode layer 902. In certain embodiments, this configuration does not adversely impact the image quality of the display.

In certain embodiments of interferometric modulators, the reduction in capacitance due to the addition of the second dielectric layer 104 is a function of the thicknesses of the dielectric layer 906 and the second dielectric layer 104 when the reflective surface 901 is in the 'near' position. In certain embodiments, the two dielectric layers 906, 104 comprise the same material, while in other embodiments, the two dielectric layers comprise different materials. The capacitance of an interferometric modulator can be approximated by the equation below when the dielectric layer 906 and the second dielectric layer 104 are the same material.

$$\text{Capacitance} \sim (\text{Area of the reflective surface } 901) \times (\text{Dielectric Constant}) \times (\text{Permittivity Constant}) / (\text{Thickness of Top Dielectric } 906 + \text{Thickness of Bottom Dielectric } 104).$$

Figure 13:
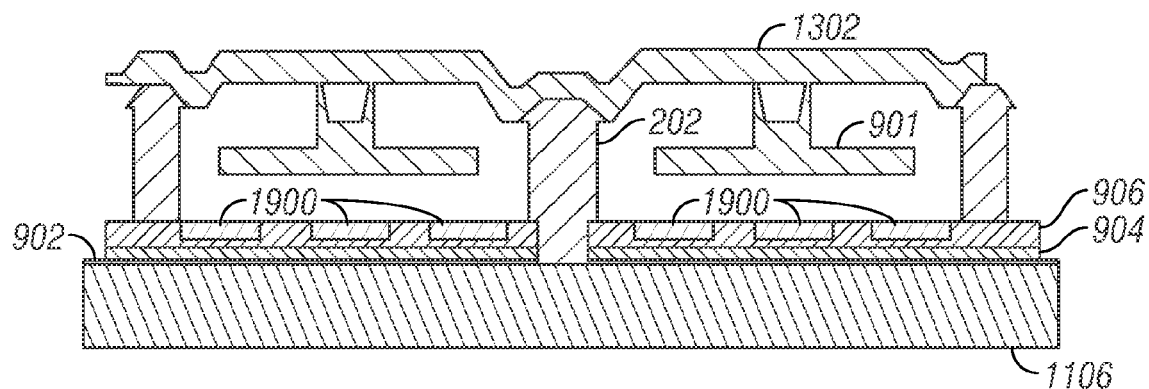
FIG. 13 shows a cross-sectional view of an embodiment of an interferometric modulator having air pockets located within the dielectric layer.

In certain embodiments, the thickness of the dielectric layer 906 may vary. As illustrated in FIG. 13, the dielectric layer 906 comprises one or more air gaps 1900 embedded within the dielectric layer 906.

Figure 14:
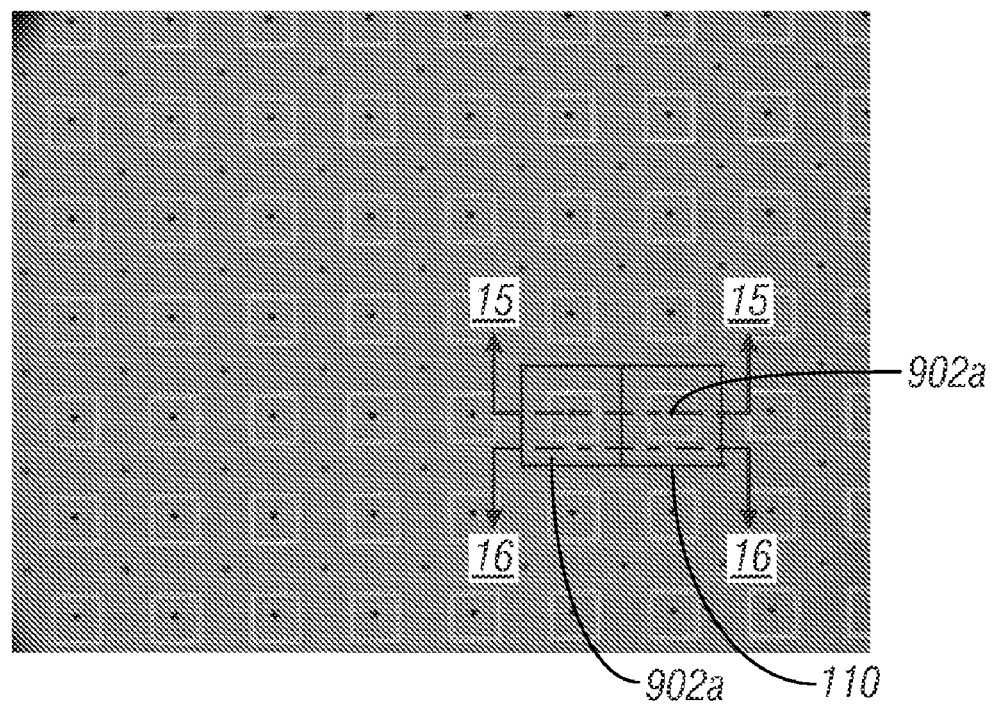
FIG. 14 shows an embodiment of a patterned electrode with a decreased electrically active area.
Figure 17:
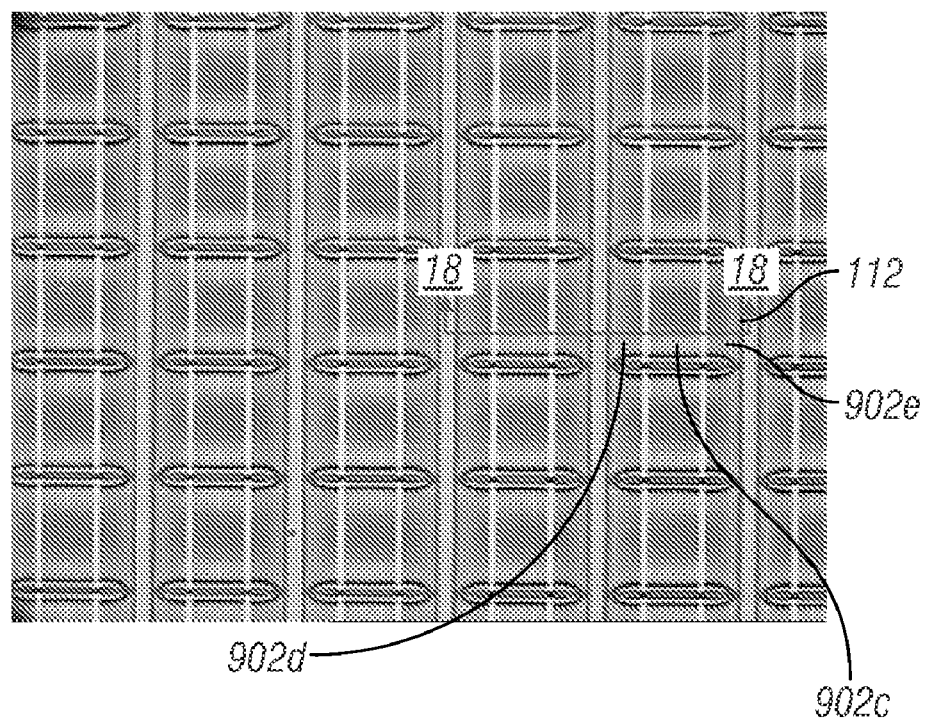
FIG. 17 shows an alternative embodiment of a patterned electrode.

FIGS. 14 and 17 illustrate an array of adjacent interferometric modulators 110 arranged in rows and columns, each having a center portion of the first electrode layer 902 that is electrically isolated from a peripheral portion of the first electrode layer 902. In certain embodiments, cuts in the first electrode layer 902 separate the center portion from the peripheral portion. In certain such embodiments, the area of the portion of the first electrode layer 902 participating in the driving of the interferometric modulator is reduced, thereby reducing the capacitance of the circuit.

Figure 15:
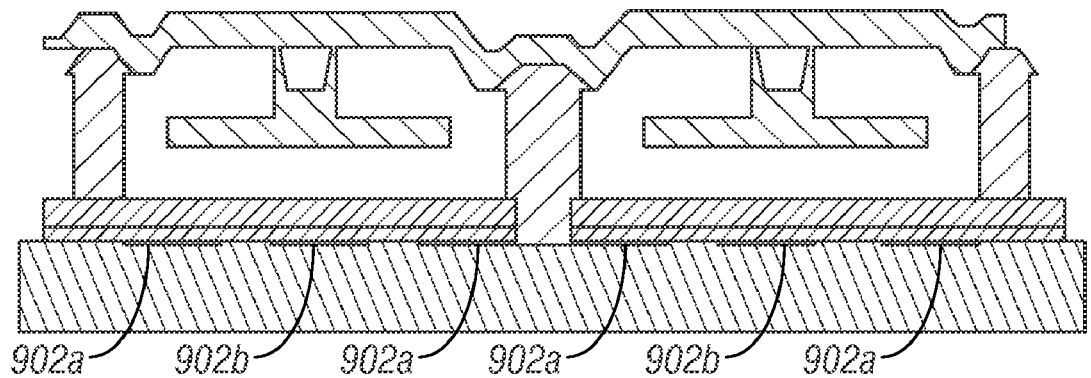
FIG. 15 is a cross-sectional view of an interferometric modulator corresponding to FIG. 14 in a plane through active and inactive areas.
Figure 16:
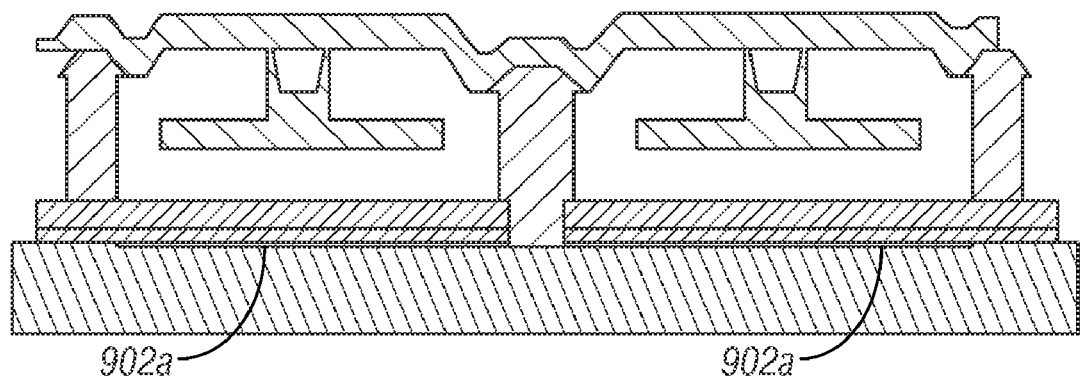
FIG. 16 is another cross-sectional view of an interferometric modulator corresponding to FIG. 14 in a plane through the active area only.

In certain embodiments, only the peripheral portion contributes to the electrically active area of the first electrode layer 902. In certain such embodiments, the peripheral portions are electrically connected to a conductive bus structure. In certain other embodiments, only the center portion contributes to the electrically active area of the first electrode layer 902. In certain such embodiments, the center portions are electrically connected to a conductive bus structure. FIGS. 15 and 16 are cross-sections of two adjacent interferometric modulators from FIG. 14 having an electrically active center portion 902(a) which is electrically isolated from a peripheral portion 902(b) of both interferometric modulators.

Figure 18:
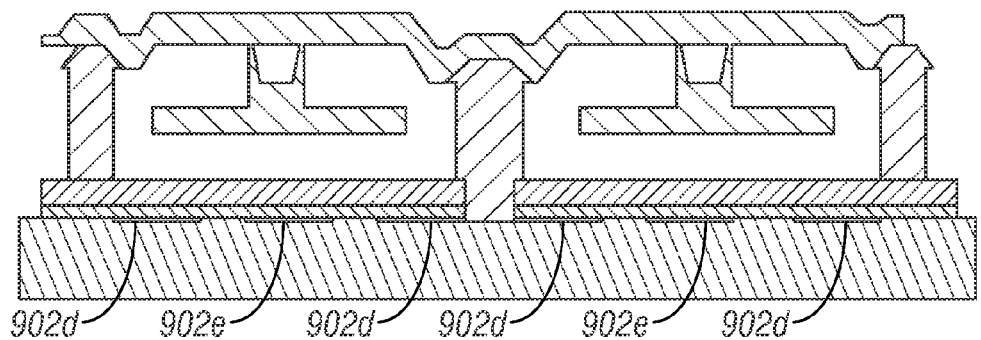
FIG. 18 is a cross-sectional view of the interferometric modulator corresponding to FIG. 17.

FIG. 17 illustrates an array of interferometric modulators 112 arranged in rows and columns, each interferometric modulator 112 having a first electrode layer 902 with a column portion 902(c) that is electrically isolated from two peripheral portions 902(d), 902(e) of the first electrode layer 902. In certain embodiments, one or more of the peripheral portions 902(c), 902(d), 902(e) contribute to the electrically active area of the first electrode layer 902 and one or more of the peripheral portions 902(c), 902(d), 902(e) do not contribute to the electrically active area of the first electrode layer 902. FIG. 18 is a cross-section view of two interferometric modulators 112 from FIG. 17 having electrically active peripheral portions 902(d), 902(e) electrically isolated from non-electrically active column portions 902(c) of both interferometric modulators.

Figure 19:
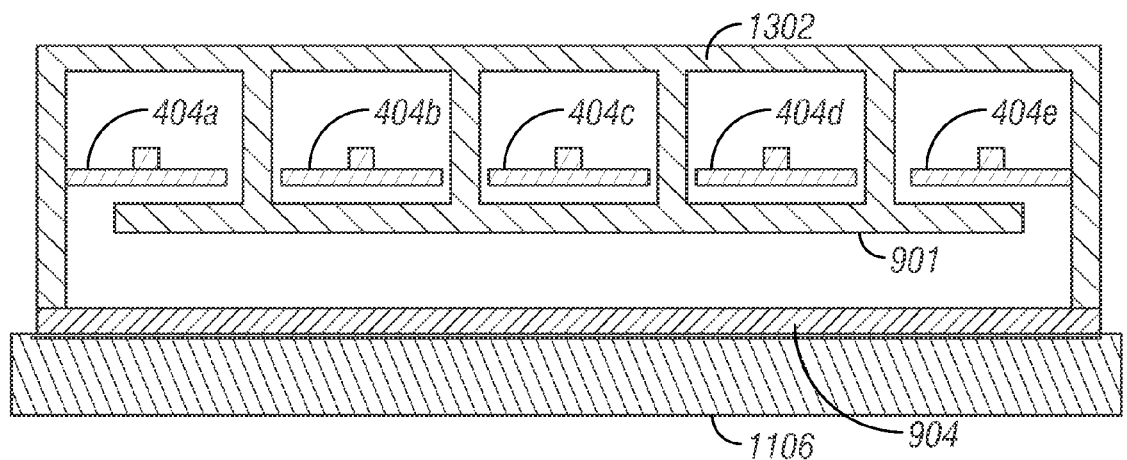
FIG. 19 shows an embodiment of an interferometric modulator having the area responsible for the electrostatic force decoupled from the reflective surface layer.
Figure 20:
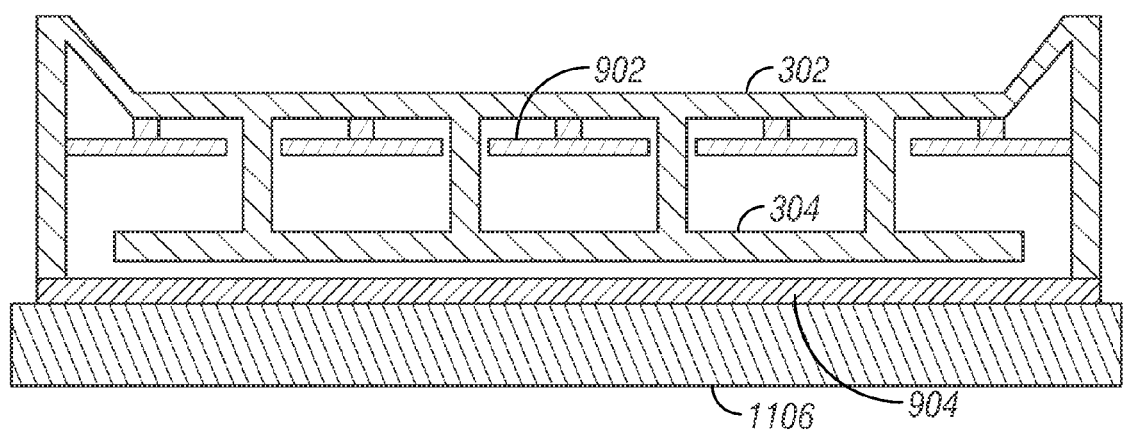
FIG. 20 shows an embodiment of the interferometric modulator of FIG. 19 in an "On" state.

FIGS. 19 and 20 illustrate an embodiment of an interferometric modulator having a first electrode layer 902 comprising more than two electrically active areas 404(a)-(e). Together, the electrically active areas 404(a)-(e) and the second electrode layer 1302 form an electrostatic force which pulls the second electrode layer 1302 towards the electrically active areas 404(a)-(e). As the second electrode layer 1302 moves towards the electrically active areas 404(a-(e), the reflective surface 901 moves a corresponding distance relative to the substrate 1106 and the metal layer 904. The movement of the reflective surface 901 turns the interferometric modulator 'ON' or 'OFF' as described above. By decoupling the two functions, the area of the electrically active portion of the optical layer (or of the mechanical layer) can be reduced to be smaller than the area of the optical portion of the optical layer (or of the mechanical layer).

Reduce Power Consumption

An additional benefit of reducing the resistance or capacitance of the circuit is a reduction in power consumption. For example, to charge and discharge an array of interferometric modulators, the column and row drivers require power to charge and discharge the interferometric modulators. By reducing the capacitance of the individual interferometric modulators, the row and column drivers can apply a lower voltage when activating each interferometric modulator. In certain embodiments, a reduction in the activation voltage is achieved by changing the mechanical stiffness of the interferometric module and/or affecting the strength of the electrostatic force within the interferometric modulator.

For example, geometric changes of the interferometric module can reduce the mechanical stiffness of the second electrode layer 1302. Exemplary geometric changes include increasing the spacing between adjacent support posts 202 or changing the shape of the second electrode layer 1302. In certain embodiments, increasing the nominal spacing between support posts 202 increases the flexibility of the second electrode layer 1302 attached thereto. This increase in flexibility allows the second electrode layer 1302 and the reflective surface 901 to change states in response to the column or row driver applying a lower activation voltage.

Figure 21:
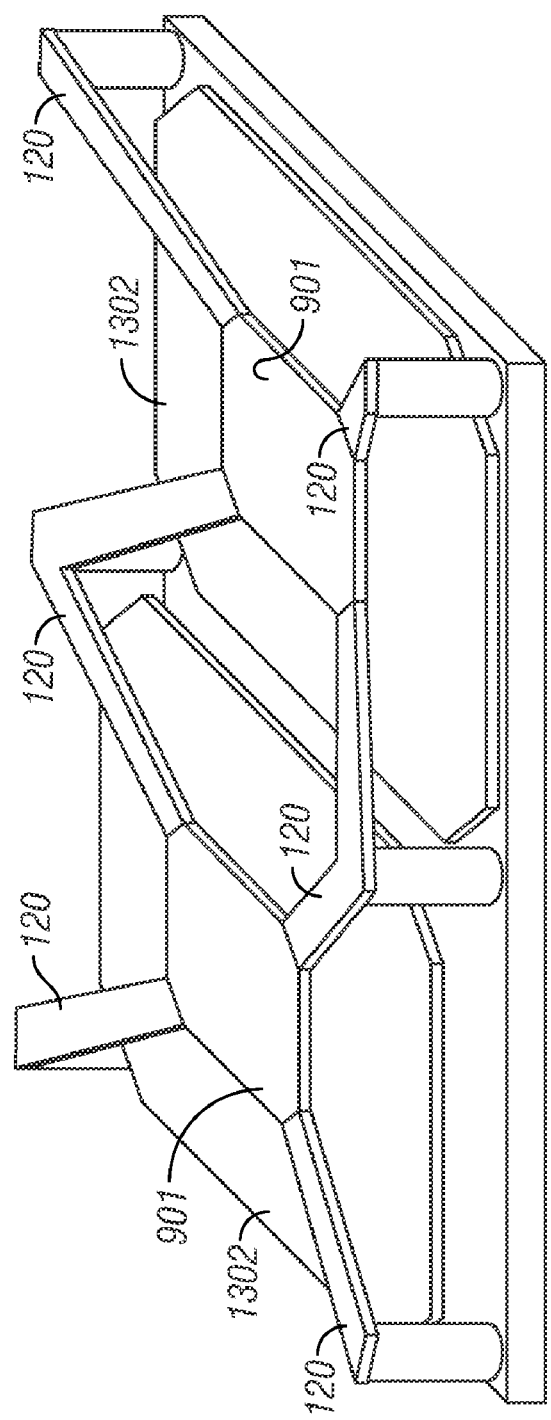
FIG. 21 shows a perspective view of an embodiment of an interferometric modulator having a spring design for the second electrode layer.

In certain embodiments, as shown in FIG. 21, the geometry of the second electrode layer 1302 can be changed so as to simulate a mechanical spring. The mechanical spring design de-couples the reflective surface 901 from the second electrode layer 1302. Tethers 120 constitute a spring portion while the reflective surface 901 moves up and down. In certain embodiments, the reflective surface 901 comprises a portion of a rigid body, such as a reflective surface layer. In this way, the tethers 120 and reflective surface 901 are decoupled in that movement of one does not substantially affect the other.

The selection of the material for the second electrode layer 1302 can affect the activation voltage. Selecting a more compliant material increases the flexibility of the second electrode layer 1302. In this way, in certain embodiments, the row and column drivers apply a lower activation voltage and still achieve the desired reflective surface layer displacement. In certain embodiments, the second electrode layer 1302 comprises a more compliant material such as aluminum to allow the reflective surface layer 901 to respond to a lower activation voltage than does a second electrode layer 1302 comprising nickel. Other exemplary materials that could be used for the second electrode layer 1302 include, but are not limited to, Cr, Cu, composites made of oxides and metal (for example, Silicon Nitride encased by aluminum), organic films reinforced by metal (for example, photoresist plated with any of the metal examples). The mechanical stiffness of the second electrode layer 1302 can be further decreased by reducing the thickness of the second electrode layer 1302. In certain embodiments, the second electrode layer 1302 has a thickness of about 500 angstroms.

Another technique in certain embodiments for reducing the activation voltage is to change the strength of the electric field created between the first electrode layer 902 and the second electrode layer 1302. The strength of the electric field is increased by patterning the first electrode layer 902 to reduce the amount of electrically active area. In this way, the area of the interferometric modulator which forms the electrically active portion is reduced. Patterning the electrode by decreasing the electrically active area as illustrated in FIGS. 14-18 has the effect of increasing the actuation voltage assuming all other parameters are held constant.

The activation voltage can be further reduced in certain embodiments by selecting materials for the one or more dielectric layers 906 that have higher dielectric constants. To first order, the relationship between dielectric constant and actuation voltage is:

$$V \sim 1/(K^{1/2}).$$

The voltage is inversely proportional to the square root of the dielectric constant. Thus, as the constant is increased, it takes less voltage to pull the second electrode layer 1302 towards the first electrode layer 902. Materials with higher dielectric constants increase the resulting electrostatic attraction between the first and second electrode layers.

Figure 22:
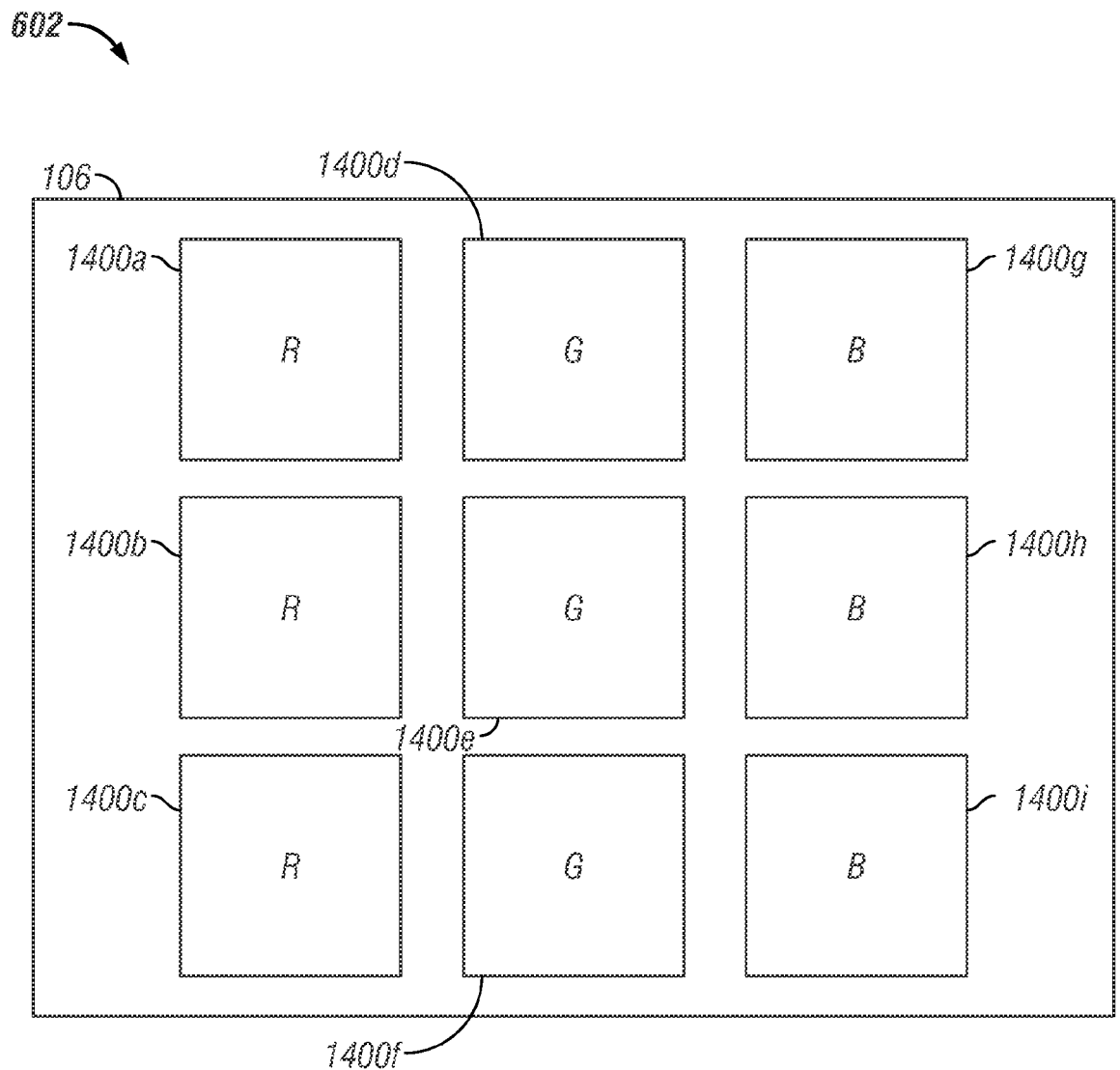
FIG. 22 shows a layout view of a pixel comprising a 3×3 array of interferometric modulators.

One possible pixel configuration 602 in accordance with certain embodiments is shown in FIG. 22. This view is as seen by the viewer from the front surface of a substrate 106, and is comprised of nine elements, three for each of the colors red, green and blue. The modulators 1400(a), 1400(b), 1400(c) may correspond to red, 1400(d), 1400(e), 1400(f) to green and 1400(g), 1400(h), 1400(i) to blue, as shown. The array of interferometric modulators in the embodiment schematically illustrated by FIG. 22 is arranged in an N×N matrix so as to provide a display surface for an image.

Figure 23:
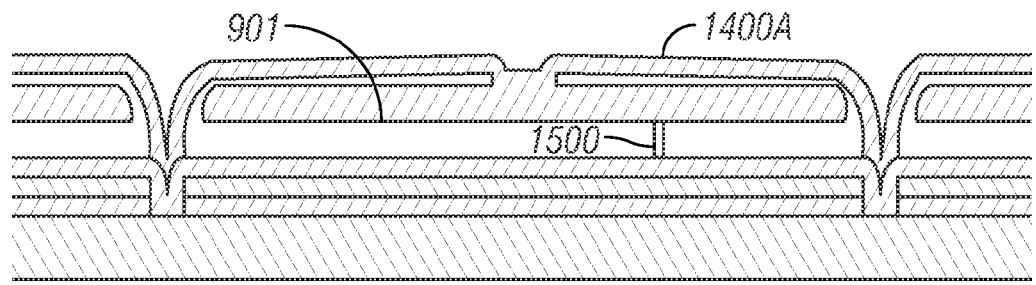
FIG. 23 shows a cross-sectional view of an embodiment of a red interferometric modulator from the array in FIG. 22.
Figure 24:
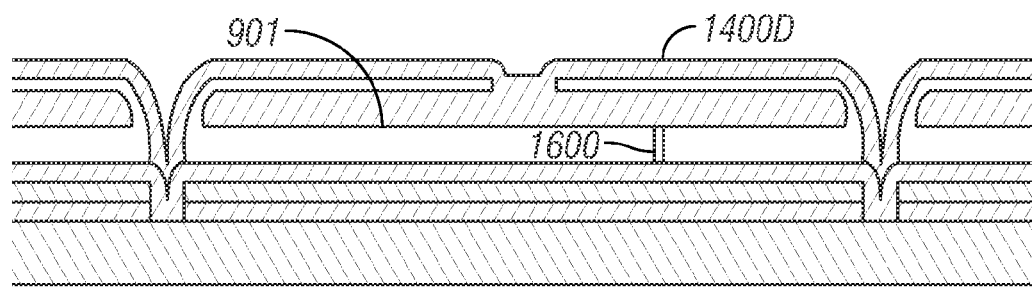
FIG. 24 shows a cross-sectional view of an embodiment of a green interferometric modulator from the array in FIG. 22.
Figure 25:
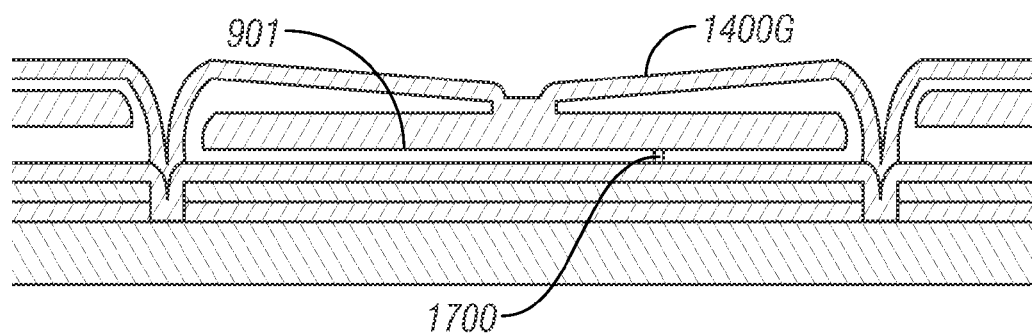
FIG. 25 shows a cross-sectional view of an embodiment of a blue interferometric modulator from the array in FIG. 22.

The three different colors (red, green, and blue) may be achieved in certain embodiments by varying the distance between the mirror and the optical stack. When a voltage is applied to the modulators, they may all move a uniform distance towards the electrode or they may all move different distances toward the electrode. Indeed, all nine modulators may traverse the entire cavity and move to a near position that brings them into direct contact with the substrate 106. The dimensions of the cavities in the quiescent state are shown by the vertical dimensions 1500, 1600 and 1700, in FIGS. 23, 24 and 25, respectively. In one embodiment, the vertical dimensions 1500, 1600, and 1700 are 4000 angstroms, 3000 angstroms, and 2000 angstroms, respectively.

Interferometric modulators are minuscule, typically 25-60 microns on a side (400-1,000 dots per inch). Therefore, in certain embodiments, many interferometric modulators elements can be ganged and driven together as a pixel, or sub-pixel in a monochrome, color, or grayscale display. For example, each interferometer modulator can correspond to a single display pixel in a monochrome display. For color or grayscale displays, the color or intensity of each interferometric modulator in certain embodiments is determined by the size of the air gap between the optical and mechanical layers. Multiple sub-elements having different intensities or colors form a grayscale or color pixel. To create a flat panel display, a large array of interferometric modulators are fabricated in the desired format (for example, 5" full color VGA) and packaged.

The reflective surface 901 of modulator 1400(a) in certain embodiments may have back supports, a flex layer and support post interfaces designed to cause the reflective surface 901 to settle at a distance 1500. The reflective surface 901 of modulator 1400(d) in certain embodiments may have back supports, a flex layer, and support post interfaces designed to cause the reflective surface layer to settle at a distance 1600 that is less than distance 1500. Finally, the reflective surface layer 901 of modulator 1400(g) in certain embodiments may have back supports, a flex layer and support post interfaces designed to cause the reflective surface layer to settle at a distance 1700 that is less than the distance 1600. In this way, controlling the mechanical properties and/or the physical restraints of the supports in certain embodiments results in three different cavity dimensions, and thus three different pixel colors are created.

Alternatively, the differing characteristics of the flex layer and supports could be manipulated to cause the reflective surface layer 901 to move different distances upon application of the same voltage. As yet another alternative, the modulators could all have the same structures, but differing voltages applied for differing colors.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. Methods for incorporating the features described above with the interferometric modulators will be readily apparent to one having ordinary skill in the art. Further, one or more of these features may be adapted to work with any of the embodiments, as well as other configurations of the interferometric modulators. As will be recognized, the present invention may be embodied within a form that does not provide all of the features and benefits set forth herein, as some features may be used or practiced separately from others.

What is claimed is:

1. A device comprising:
    a substrate;
    a first electrode layer over the substrate, the first electrode layer having a first electrical resistance;
    a second electrode layer over the substrate, the second electrode layer having a second electrical resistance;
    a movable layer; and
    a conductive bus layer having a third electrical resistance lower than the first electrical resistance or the second electrical resistance, at least a portion of the conductive bus layer electrically coupled to at least one of the first electrode layer and the second electrode layer.

2. The device of claim 1, wherein the conductive bus layer comprises a conductive metal.

3. The device of claim 1, wherein the conductive bus layer comprises a composite alloy.

4. The device of claim 1, wherein the conductive bus layer comprises aluminum, chromium, titanium, or nickel.

5. The device of claim 1, wherein the conductive bus layer has a thickness between 0.1 micron and 2 microns.

6. The device of claim 1, wherein the conductive bus layer has a thickness between 4 microns and 10 microns.

7. The device of claim 1, wherein the first electrode layer has a thickness between 300 angstroms and 2,000 angstroms.

8. The device of claim 1, further comprising:
    a display;
    a processor configured to communicate with said display, said processor being configured to process image data; and
    a memory device configured to communicate with said processor.

9. The device of claim 8, further comprising a driver circuit configured to send at least one signal to the display.

10. The device of claim 9, further comprising a controller configured to send at least a portion of the image data to the driver circuit.

11. The device of claim 8, further comprising an image source module configured to send said image data to said processor.

12. The device of claim 11, wherein the image source module comprises at least one of a receiver, transceiver, and transmitter.

13. The device of claim 8, further comprising an input device configured to receive input data and to communicate said input data to said processor.

14. A device comprising:
    means for supporting at least a portion of the device;
    first means for conducting electricity over the supporting means, the first conducting means having a first electrical resistance;
    second means for conducting electricity over the supporting means, the second conducting means having a second electrical resistance;
    means for moving at least a portion of the device; and
    third means for conducting electricity, the third conducting means having a third electrical resistance lower than the first electrical resistance or the second electrical resistance, at least a portion of the third conducting means electrically coupled to at least one of the first conducting means and the second conducting means.

15. The device of claim 14, wherein the first conductive means comprises a first electrode layer.

16. The device of claim 14, wherein the second conductive means comprises a second electrode layer.

17. The device of claim 14, wherein the means for moving comprises a movable layer.

18. The device of claim 14, wherein the third conductive means comprises a conductive bus layer.

19. A device comprising:
    a plurality of structures, each structure comprising a first electrode layer having a first electrical resistance and a first electrical conductance, a second electrode layer having a second electrical resistance and a second electrical conductance, and a surface substantially parallel to the first electrode layer and coupled to the second electrode layer, the first electrode layer and the second electrode layer having a region therebetween, the surface responsive to a voltage applied to at least one of the first electrode layer and the second electrode layer by moving within the region along a direction substantially perpendicular to the surface; and
    a conductive bus layer interconnecting the plurality of structures, at least a portion of the conductive bus layer electrically coupled to the first electrode layers or the second electrode layers of the plurality of structures, wherein the conductive bus layer is configured to reduce a resistance-capacitance time constant between a driver and the device as compared to a device having serially connected electrode layers.

20. The device of claim 19, wherein the conductive bus layer has a third electrical resistance lower than the first electrical resistance or the second electrical resistance.

21. The device of claim 19, wherein the conductive bus layer has a third electrical conductance greater than the first electrical conductance or the second electrical conductance.

22. A device comprising:
    a plurality of optical modulators, each optical modulator comprising a first electrode layer, a second electrode layer, and a reflective surface substantially parallel to the first electrode layer and coupled to the second electrode layer, the first electrode layer and the second electrode layer having a region therebetween, the reflective surface responsive to a voltage applied to at least one of the first electrode layer and the second electrode layer by moving within the region along a direction substantially perpendicular to the reflective surface; and
    a conductive bus layer interconnecting the plurality of optical modulators, at least a portion of the conductive bus layer electrically coupled to the first electrode layers or the second electrode layers of the plurality of optical modulators, wherein the conductive bus layer is configured to avoid interference with an optical performance of the device.

* * * * *